(12) United States Patent
Kunikiyo

(10) Patent No.: US 6,341,087 B1
(45) Date of Patent: Jan. 22, 2002

(54) SEMICONDUCTOR DEVICE

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/668,360

(22) Filed: Sep. 25, 2000

(30) Foreign Application Priority Data

Mar. 28, 2000 (JP) ............................................. 12-088772

(51) Int. Cl.$^7$ ................................................. G11C 7/00
(52) U.S. Cl. ................................... 365/189.09; 365/227
(58) Field of Search ........................... 365/189.09, 226, 365/227, 149

(56) References Cited

U.S. PATENT DOCUMENTS

| | | | | |
|---|---|---|---|---|
| 5,471,421 A | * | 11/1995 | Rose et al. | ............. 365/189.09 |
| 5,581,500 A | * | 12/1996 | D'Souza | ................. 365/189.09 |
| 5,774,411 A | | 6/1998 | Hseih et al. | ........... 365/230.06 |
| 6,124,752 A | | 9/2000 | Kuroda | ....................... 327/534 |

FOREIGN PATENT DOCUMENTS

| | | |
|---|---|---|
| JP | 8-124243 | 7/1983 |
| JP | 11-340465 | 12/1999 |

OTHER PUBLICATIONS

Hiroshi Kawaguchi, et al., "Dynamic Leakage Cut–Off Scheme for Low–Voltage SRAM's," Symposium on VLSI Circuits Digest of Technical Papers, 1998, pp. 140–141.

Ji–Woon Yang, et al., "Hot–Carrier Degradation Behavior in Body–Contacted SOI nMOSFETS," IEEE International SOI Conference Proceedings, Oct. 6–9, 1997, pp. 38–39.

* cited by examiner

Primary Examiner—Tan T. Nguyen
(74) Attorney, Agent, or Firm—Oblon, Spivak, McClelland, Maier & Neustadt, P.C.

(57) ABSTRACT

A body bias generation circuit supplies a body region of a PMOS transistor with a body potential. The body potential is applied so that the body region may be reversely biased or not biased relative to the source region in response to an input signal. The input signal is inputted so that the zero bias may be applied to the body region during standby of the PMOS transistor and the reverse bias may be applied during operation. A body bias generation circuit supplies a body region of an NMOS transistor with a body potential in response to an inverted signal of the input signal. With this constitution, a leak current during standby can be suppressed.

17 Claims, 17 Drawing Sheets

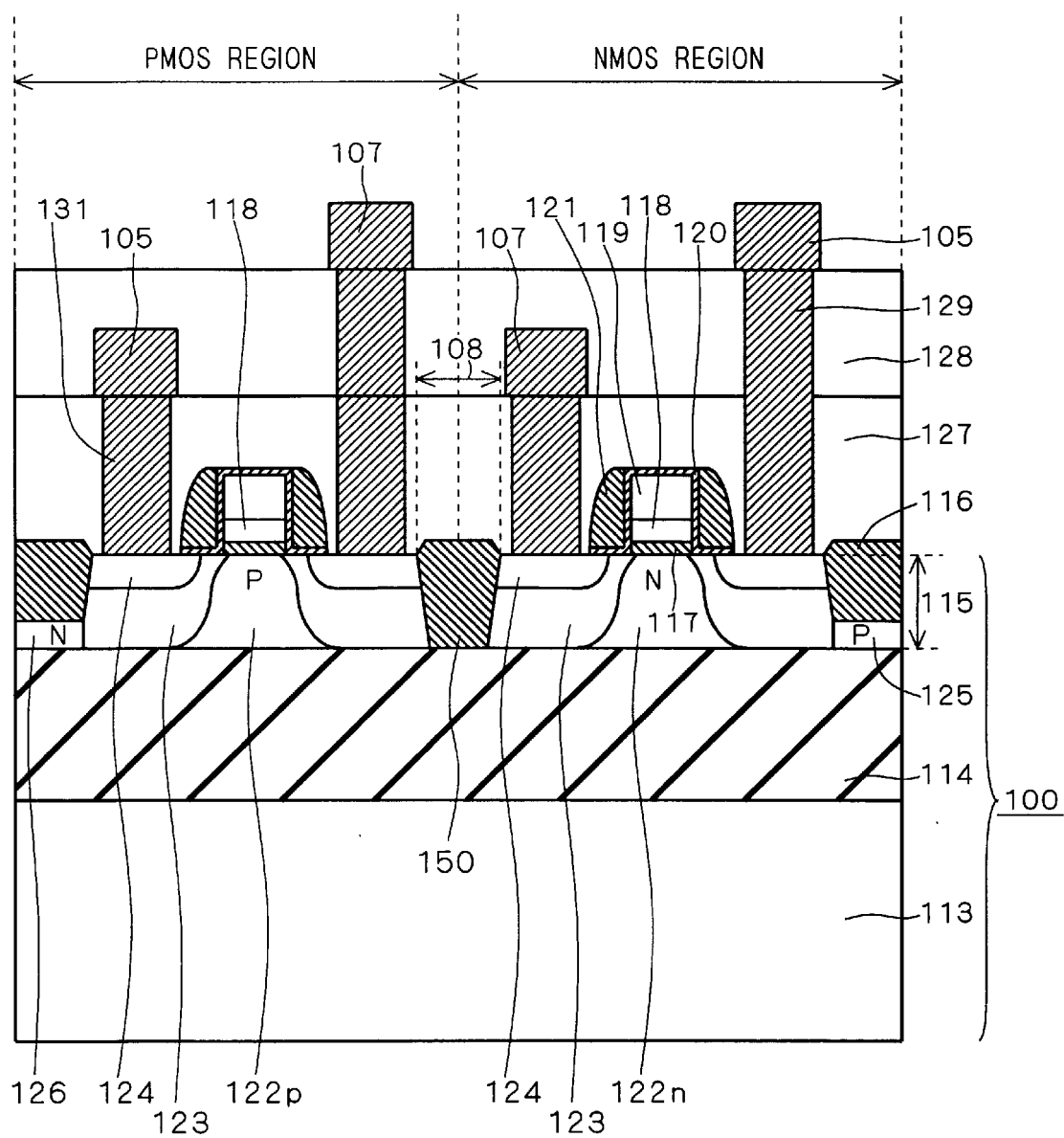
F I G. 4

F I G. 17
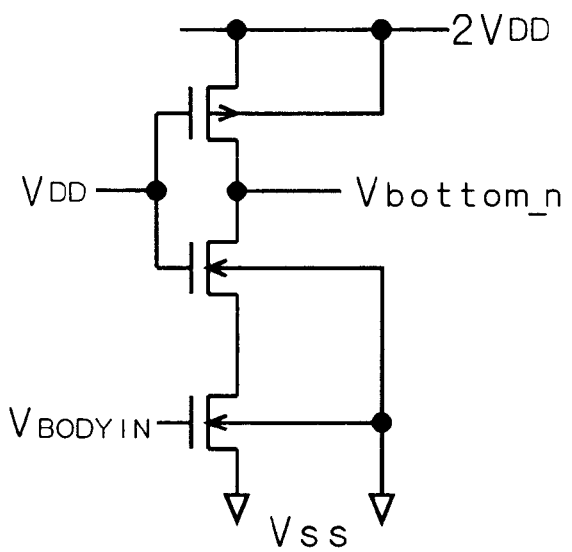
F I G. 18
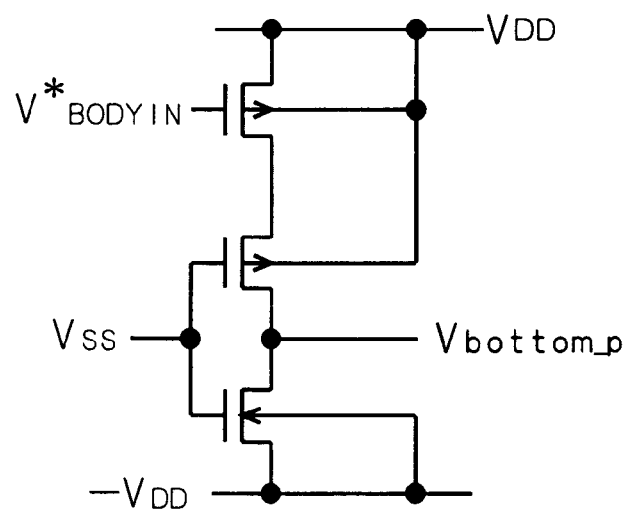

F I G. 19A
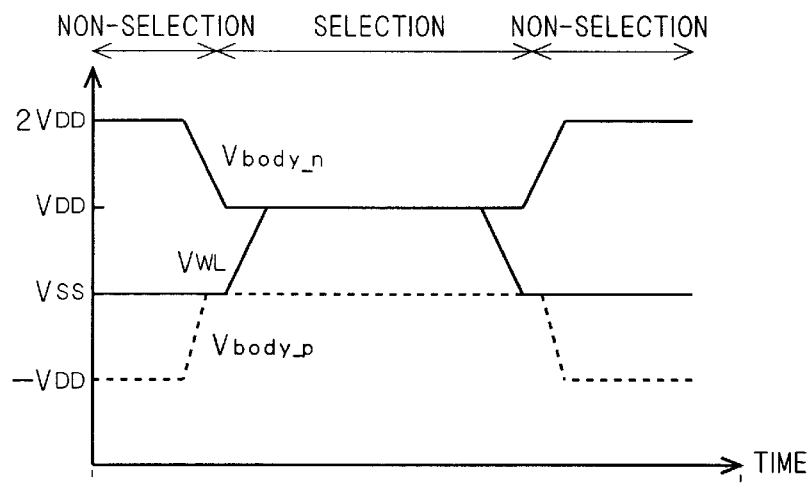
F I G. 19B
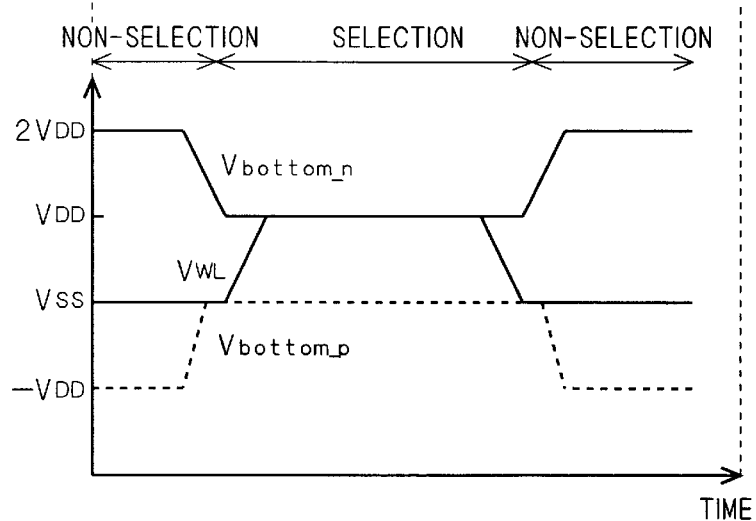

SEMICONDUCTOR DEVICE

BACKGROUND OF THE INVENTION

1. Field of the Invention

The present invention relates to a semiconductor device suitable for an SOI-type semiconductor device, and more particularly to an improvement to suppress a leak current during standby and a circuit delay during operation.

2. Description of the Background Art

In the present specification, the term "MOS transistor (MOSFET)" broadly includes an insulated gate transistor whose gate electrode is made of a conductive material other than metal as well as made of metal in accordance with the conventional practice in this field. Further, an insulated gate semiconductor element comprising another electrode interposed between a control electrode and a channel region such as a memory element of flash EEPROM is also referred to as a MOS transistor.

For achieving a system LSI, it is known that it is more advantageous in degree of integration, operating speed and power consumption to form a CMOS transistor (complementary MOS transistor: CMOSFET) which is a constituent element of an LSI in a main surface of an SOI (Silicon On Insulator) substrate than in a main surface of a bulk-type semiconductor substrate. FIG. 20 is a cross section schematically showing a structure of an SOI substrate. In an SOI substrate 100, a buried oxide layer (BOX layer) 114 made of a silicon oxide is formed on a supporting substrate 113 which is a semiconductor substrate mainly made of a silicon and an SOI layer 115 made of a crystalline silicon is formed further thereon.

The BOX layer 114 has a thickness of about 0.01 μm to 0.4 μm and the SOI layer 115 has a thickness of about 0.1 μm to 1 μm. MOS transistors are formed in a main surface of the SOI layer 115. The MOS transistors are isolated from one another by LOCOS or STI (Shallow Trench Isolation). A channel region in an active region of the MOS transistor is also referred to as a body region.

The semiconductor device having an SOI structure constituted of the supporting substrate 113, the BOX layer 114 and the SOI layer 115, in which the active region is surrounded by the BOX layer 114 and an isolation insulating film 150 (hereinafter, referred to as "full isolation" or "Full STI: Full Shallow Trench Isolation" and abbreviated to "FTI") whose bottom surface reaches the BOX layer 114, has an advantage that no latch up occurs even if the CMOS transistor is formed in the SOI layer 115. Further, since source/drain regions of the MOS transistor are in contact with the BOX layer 114, obtained is an advantage that junction capacitance becomes smaller, high-speed operation is available, a leak current during standby becomes smaller and power consumption is reduced as compared with a semiconductor device in which the MOS transistors are formed directly in the main surface of the semiconductor substrate.

When the SOI layer 115 which is a semiconductor layer formed on the BOX layer 114 has a thickness not less than e.g., 0.15 μm, however, carriers (positive hole in an NMOS transistor and electrons in a PMOS transistor) generated by impact ionization phenomenon are accumulated immediately below the channel region. This raises problems that kink appears in the Ids-Vds characteristic of a transistor and that an operating breakdown voltage is deteriorated. Further, since there are various problems caused by a floating-substrate effect such as frequency dependency appearing in the delay time due to an unstable potential of the channel region, the potential of the channel region is normally fixed. The semiconductor device in which the potential of the channel region is fixed as above is disclosed in Japanese Patent Application Laid Open No. 58-124243 (1983).

Recently has been made an attempt that an isolation insulating film 116 (hereinafter, "partial isolation" or "Partial STI: Partial Shallow Trench Isolation" and abbreviated to "PTI") whose bottom surface does not reach the BOX layer 114 is used for isolation so as to collectively fix the potentials of the channel regions of a plurality of transistors of the same conductivity type, instead of individually fixing the potentials of the channel regions of MOS transistors, thereby promoting miniaturization. The semiconductor device having this structure is disclosed in IEEE international SOI Conference, October (1997) and the like.

FIG. 21 is a plan view showing a semiconductor device in the background art. In the semiconductor device, an NMOS region and a PMOS region are formed in the SOI layer, and a plurality of NMOS transistors are formed in the NMOS region and a plurality of PMOS transistors are formed in the PMOS region. An active region 102 of each MOS transistor is formed and a pair of source/drain regions 103 and 104 are formed with a channel region interposed therebetween in the active region 102. One of the source/drain regions 103 and 104 is a source region and the other is a drain region, both of which serve as a source of carriers (electrons or positive holes) or have a function of draining the carriers out, and each of them is referred to as "a source/drain region" in the present specification.

A body contact region 112 is formed in each of the NMOS region and the PMOS region. The body contact region 112 and the active region 102 of each MOS transistor are isolated from each other by a PTI 101 serving as an isolation region. The body contact region 112 is provided to fix the potential of the channel regions (body regions) of a plurality of MOS transistors of the same conductivity type.

Source/drain lines 105 and 107 are connected to the source/drain regions 103 and 104, respectively. Further, a gate electrode (gate line) 106 is provided above the channel region. The gate electrode 106 is connected to a metal wire 110 through a gate electrode contact 109. A metal wire 111 is connected to the contact region 112. An isolation width 108 refers to the width of the PTI 116 which isolates the NMOS region and the PMOS region.

FIG. 22 is a cross section taken along the line A—A off FIG. 21. A pair of source/drain regions 103 and 104 are selectively formed with an N-type channel region 122p or a P-type channel region 122n interposed therebetween in each of the active regions 102 formed in the SOI layer 115. A high-concentration source/drain region 124 and a low-concentration source/drain region 123 are formed in each of the source/drain regions 103 and 104. The PTI 116 isolating two adjacent active regions 102 does not reach the BOX layer 114 and a P-type channel stopper 125 and an N-type channel stopper 126 are formed immediately below the PTI 116.

A gate insulating film 117 is formed on the channel regions 122p and 122n and the gate electrode 106 having a double-layered structure consisting of a doped polysilicon layer 118 and a metal layer 119 is formed on the gate insulating film 117. Specifically, the gate electrode 106 is opposed to the channel regions 122p and 122n with the gate insulating film 117 interposed therebetween. The gate electrode 106 is covered with an insulating film 120 and a sidewall 121 is formed on a side surface of the gate electrode 106 with the insulating film 120 interposed therebetween. The source/drain lines 105 and 107 are connected to the source/drain regions 103 and 104 through contact plugs 131 and 129 penetrating interlayer insulating films 127 and 128.

The parasitic capacitance of the source/drain region 103 or 104 of the MOS transistor is generated by junction between the same and the channel region 122p or 122n and that between the same and the channel stopper 125 or 126. To improve the operating speed of the MOS transistor, it is desirable that the parasitic capacitance should be small.

The leak current of the MOS transistor during standby is caused by a generated current flowing in a depletion layer created by application of reverse bias to a junction formed between the source/drain regions 103 and 104 and the channel regions 122p and 122n or that between the source/drain regions 103 and 104 and the channel stoppers 125 and 126. Further, the generated current is generated also when the reverse bias is applied to the junction formed between the channel stoppers 125 and 126. This current also contributes to the leak current. If the leak current during standby is large, the power consumption of the whole semiconductor chip increases. Therefore, it is desirable that the leak current during standby should be small.

FIG. 23 is a cross section of the PMOS region taken along the line B—B of FIG. 21. The gate electrode 106 is connected to the metal wire 110 through the contact plug 109 penetrating the interlayer insulating film 127. Further, the body contact region 112 is connected to the metal wire 111 through the contact plug 135 penetrating the interlayer insulating film 127. Furthermore, the body contact region 112 containing an N-type impurity of high concentration is connected to the N-type channel region 122p through the N-type channel stopper 126.

Though not shown, in the NMOS region, the body contact region 112 containing a P-type impurity of high concentration is connected to the P-type channel region 122n through the P-type channel stopper 125. Therefore, by supplying the metal wire 111 with a bias potential individually in the PMOS region and the NMOS region, it is possible to fix the channel regions 122p and 122n to the bias potential.

In the semiconductor device in which a plurality of MOS transistors formed in the SOI substrate 100 are isolated from one another by the PTI 116, however, since the leak current during standby flows through the channel stopper immediately below the PTI 116, there arises a problem that the power consumption during standby becomes larger as compared with that in the semiconductor device using the FTI 150 as an isolation. Further, during operation, there are problems that a substrate current is generated by electric charges accumulated in the channel region (body region) 122 and there may be a case, depending on the operating frequency, where noise is superimposed on a circuit signal and a circuit operation becomes slower due to variation in threshold voltage caused by the substrate current.

SUMMARY OF THE INVENTION

An object of the present invention is to provide a semiconductor device capable of suppressing the leak current during standby and the circuit delay during operation.

The present invention is directed to a semiconductor device. According to a first aspect of the present invention, the semiconductor device comprises: at least one MOS transistor formed in a main surface of a semiconductor substrate, being a constituent element of a circuit operating in synchronization with a system clock; and a body bias generation circuit for applying a body potential to a body region of the at least one MOS transistor at a different level including a potential of reverse bias relative to a source region in response to a signal of the circuit operating in synchronization with the system clock.

According to a second aspect of the present invention, in the semiconductor device according to the first aspect, the body bias generation circuit selectively applies one of the potential of reverse bias and a potential of zero bias relative to the source region to the body region as the body potential.

According to a third aspect of the present invention, in the semiconductor device according to the first aspect, the body bias generation circuit selectively supplies the body region with one of M (M≧2) supply currents of different magnitudes.

According to a fourth aspect of the present invention, in the semiconductor device according to the third aspect, the body bias generation circuit comprises M oscillator circuits for generating M clocks having different frequencies; and M charge pump circuits for intermittently supplying the body region with currents individually in synchronization with the M clocks.

According to a fifth aspect of the present invention, in the semiconductor device according to the fourth aspect, the body bias generation circuit comprises a monitor circuit for comparing a difference between a potential of the body region and that of the source region with a reference value and outputting a comparison result, and one of the M oscillator circuits which generates a clock having the highest frequency so operates in response to the comparison result as to generate the clock when the difference is smaller than the reference value.

According to a sixth aspect of the present invention, in the semiconductor device according to the fourth or fifth aspect, at least one of the M clocks has a frequency higher than that of the system clock.

According to a seventh aspect of the present invention, in the semiconductor device according to any one of the fourth to sixth aspects, the circuit operating in synchronization with the system clock is a dynamic RAM, and one of the M oscillator circuits which generates a clock having the lowest frequency comprises a battery backup mode control circuit which judges whether an operating mode of the dynamic RAM is a normal operation mode or a battery backup mode, and generates the clock when it is judged that the operating mode is the normal operation mode and generates the clock only during a refresh request when it is judged that the operating mode is the battery backup mode.

According to an eighth aspect of the present invention, in the semiconductor device according to any one of the first to seventh aspects, the semiconductor substrate is an SOI substrate, the at least one MOS transistor includes a plurality of MOS transistors of the same conductivity type isolated from one another by partial isolation, the SOI substrate has a channel stopper doped with an impurity immediately below the partial isolation, and the body bias generation circuit supplies the body potential in common to the plurality of MOS transistors through the channel stopper.

According to a ninth aspect of the present invention, in the semiconductor device according to the eighth aspect, the at least one MOS transistor further includes another MOS transistor which is different in conductivity type from the plurality of MOS transistors, and the another MOS transistor and at least one of the plurality of MOS transistors adjacent thereto are isolated from each other by full isolation.

According to a tenth aspect of the present invention, in the semiconductor device according to any one of the first to ninth aspects, the semiconductor substrate is an SOI substrate, the at least one MOS transistor includes M (M≧2) MOS transistors, the M MOS transistors are arranged, being divided into N (2≦N<M) function blocks, and the body bias generation circuit is divided into L (2≦L≦N) unit body bias generation circuits and the L unit body bias generation circuits individually supply body regions of MOS transistors belonging to L groups selected among the N function blocks with the body potential of reverse bias.

According to an eleventh aspect of the present invention, in the semiconductor device according to the tenth aspect, at least two function blocks which are adjacent to each other among the N function blocks are isolated from each other by full isolation.

According to a twelfth aspect of the present invention, in the semiconductor device according to any one of the first to eleventh aspects, the semiconductor substrate is an SOI substrate, the body bias generation circuit is formed in the main surface, and the body bias generation circuit and the at least one MOS transistor is isolated from each other by full isolation.

According to a thirteenth aspect of the present invention, in the semiconductor device according to any one of the first to twelfth aspects, the semiconductor substrate is an SOI substrate, and the SOI substrate has a bottom layer which is positioned immediately below the at least one MOS transistor, being in contact with a surface on the opposite side of the main surface of a buried insulating film and is a semiconductor layer in which an impurity is introduced.

According to a fourteenth aspect of the present invention, the semiconductor device according to the thirteenth aspect further comprises: a bottom potential generation circuit for selectively applying a potential of reverse bias relative to a source region of a MOS transistor positioned immediately above the bottom layer to the bottom layer.

According to a fifteenth aspect of the present invention, in the semiconductor device according to the fourteenth aspect, the bottom potential generation circuit selectively applies one of the potential of reverse bias and the same potential as that of the source region of the MOS transistor positioned immediately above the bottom layer to the bottom layer.

According to a sixteenth aspect of the present invention, in the semiconductor device according to the fourteenth or fifteenth aspect, the bottom potential generation circuit applies the potential in synchronization with the body bias generation circuit.

According to a seventeenth aspect of the present invention, in the semiconductor device according to the thirteenth aspect, the body bias generation circuit supplies the bottom layer with a potential supplied to the body region at the same time.

In the device of the first aspect of the present invention, since the body bias generation circuit for selectively applying the body potential of reverse bias to the body region, it is possible to apply the reverse bias to the body region when the circuit including the MOS transistors is in the standby mode. That reduces the leak current during standby and achieves the semiconductor device of less current consumption.

In the device of the second aspect of the present invention, since the body bias generation circuit can selectively apply not only reverse bias but also zero bias, it is possible to operate the circuit including the MOS transistors with its body potential fixed to zero bias.

In the device of the third aspect of the present invention, the body bias generation circuit can selectively supply the body region with one of supply currents of a plurality of levels, a suitable supply current can be supplied in accordance with the magnitude of the body current flowing the MOS transistor. That makes it possible to effectively suppress accumulation of electric charges in the body region while suppressing the current consumption, and the problem of variation in threshold voltage and delay of the circuit operation can be solved.

In the device of the fourth aspect of the present invention, the body bias generation circuit for supplying a plurality of supply currents can be easily constituted of M oscillator circuits having different clock frequencies and M charge pump circuits operating individually in synchronization with the M oscillator circuits.

In the device of the fifth aspect of the present invention, since the monitor circuit is provided, it is possible to automatically supply a suitable supply current in accordance with the magnitude of the body current without inputting the control signal from the outside.

In the device of the sixth aspect of the present invention, since the oscillator circuit for generating a clock which is higher in frequency than the system clock, it is possible to remove an influence on the operation of the MOS transistor due to accumulation of the electric charges in the body region.

In the device of the seventh aspect of the present invention, since a clock of low frequency is generated only during the period while the MOS transistor operates, that is, the refresh is requested when the dynamic RAM operates in the battery backup mode by the function of the battery backup mode control circuit, it is possible to further reduce the current consumption.

In the device of the eighth aspect of the present invention, it is possible to supply the body potential to a plurality of MOS transistors through the channel stopper.

In the device of the ninth aspect of the present invention, since there is some pair of MOS transistors which are isolated from each other by full isolation among pairs of MOS transistors of different conductivity types, it is possible to further suppress the leak current.

In the device of the tenth aspect of the present invention, since the each function block or each group of function blocks is attended by the body bias generation circuit, it is possible to optimize the body potential in accordance with the operation of each function block or each group of function blocks, and the power consumption of the whole semiconductor device can be further effectively reduced.

In the device of the eleventh aspect of the present invention, since there is a pair of adjacent function blocks which are isolated from each other by full isolation among the function blocks, it is possible to further suppress the leak current.

In the device of the twelfth aspect of the present invention, since the semiconductor substrate is an SOI substrate and the body bias generation circuit and the MOS transistor which is to be supplied thereby with the body potential are isolated from each other by full isolation, it is possible to further suppress the leak current.

In the device of the thirteenth aspect of the present invention, since the bottom layer is provided, it is possible to further suppress the leak current by fixing the potential of the bottom layer.

In the device of the fourteenth aspect of the present invention, since the bottom potential generation circuit is provided, it is possible to further suppress the leak current by changing the potential of the bottom layer in synchronization with the body potential.

In the device of the fifteenth aspect of the present invention, since the bottom potential generation circuit selectively applies the same potential as that of the source region of the MOS transistor positioned immediately above the bottom layer to the bottom layer, it is possible to operate the circuit including the MOS transistors with the potential of the supporting substrate fixed to zero bias.

In the device of the sixteenth aspect of the present invention, since the bottom potential generation circuit applies the potential in synchronization with the body bias generation circuit, it is possible to further suppress the leak current.

In the device of the seventeenth aspect of the present invention, since the body bias generation circuit has the function of the bottom potential generation circuit, it is possible to simplify the circuit constitution and reduce the area of the semiconductor chip.

As a document disclosing the technique relevant to the present invention, known is Japanese Patent Application Laid Open Gazette No. 11-340465 (hereinafter, referred to as document 1).

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross section showing a preferable example of the device in accordance with the first preferred embodiment;

FIGS. 17 and 18 are circuit diagrams each showing a bottom potential generation circuit in accordance with the fourth preferred embodiment;

FIGS. 19A and 19B are timing charts showing an operation of the bottom potential generation circuit;

DESCRIPTION OF THE PREFERRED EMBODIMENTS

<1. The First Preferred embodiment>

In a semiconductor device in accordance with the first preferred embodiment of the present invention, a plurality of MOS transistors constituting an integrated circuit are formed in an SOI substrate, the MOS transistors are isolated from one another by PTIs and a body bias generation circuit is provided for changing a body potential so that the absolute value of reverse bias applied between a channel region and source/drain regions during standby may become larger than that during operation. Therefore achieved is a semiconductor device in which a subthreshold current during standby is reduced and power consumption becomes lower as compared with the background-art semiconductor device. Preferably, at least one pair of an NMOS transistor and a PMOS transistor which are adjacent to each other are isolated from each other by an FTI.

<1.1. Constitution and Operation of Device>

Figure 1:
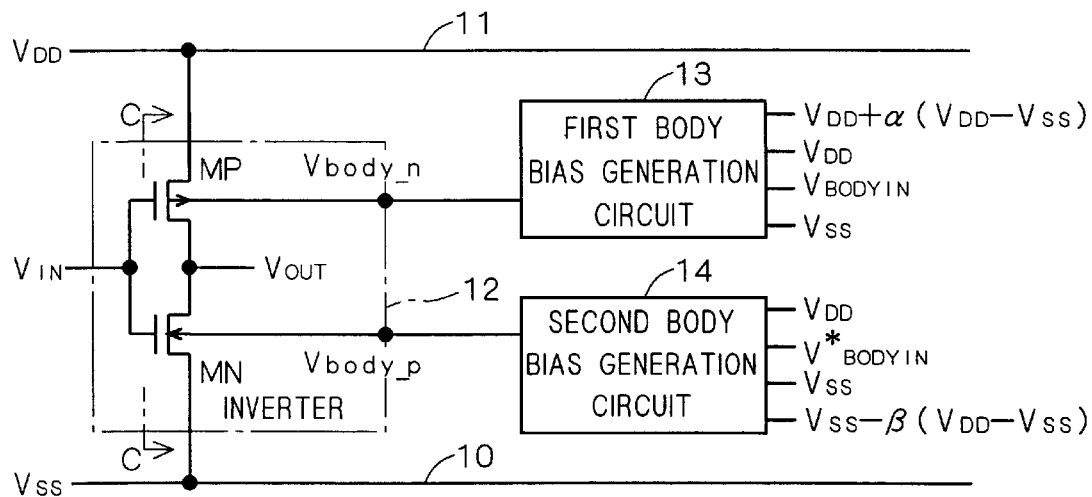
FIG. 1 is a plan view showing part of a semiconductor device in accordance with a first preferred embodiment.

FIG. 1 is a circuit diagram showing part of a semiconductor device in accordance with the first preferred embodiment. This device is characteristically different from the background-art device shown in FIGS. 21 to 23 in that body bias generation circuits 13 and 14 are provided therein.

One of a plurality of PMOS transistors, a PMOS transistor MP, and one of a plurality of NMOS transistors, an NMOS transistor MN, constitute an inverter 12. The inverter 12 corresponds to part of an integrated circuit constituted of a plurality of NMOS transistors and a plurality of PMOS transistors. The integrated circuit is supplied with a high-side power supply potential $V_{DD}$ and a low-side (ground potential side) power supply potential $V_{SS}$ as a power supply potentials. The inverter 12 outputs an inverted signal of an input signal $V_{IN}$ as an output signal $V_{OUT}$. The cross-sectional structure of the inverter 12 taken along the line C—C with FIG. 1 regarded as a plan view can be shown like FIG. 22 relating to the background art.

The body bias generation circuit 13 supplies a body potential Vbody_n to body regions of a plurality of PMOS transistors including the PMOS transistor MP. Similarly, the body bias generation circuit 14 supplies a body potential Vbody_p to body regions of a plurality of NMOS transistors including the NMOS transistor MN. Though the body bias generation circuits 13 and 14 are formed in a main surface of a single SOI substrate together with the MOS transistors to be supplied with the body potentials Vbody_n and Vbody_p, the present invention is not limited to this structure.

The body bias generation circuit 13 is supplied with a potential $V_{DD}+\alpha(V_{DD}-V_{SS})$ as the third potential as well as the high-side power supply potential $V_{DD}$ and the low-side power supply potential $V_{SS}$ and outputs one of potentials of two levels in response to an input signal $V_{BODYIN}$ as the body potential Vbody_n, where α is a positive constant. The body bias generation circuit 14 is supplied with a potential $V_{DD}+V_{SS}-\beta(V_{DD}-V_{SS})$ as the third potential as well as the high-side power supply potential $V_{DD}$ and the low-side power supply potential $V_{SS}$ and outputs one of potentials of two levels in response to an input signal $V^*_{BODYIN}$ which is an inverted signal of the input signal $V_{BODYIN}$ as the body potential Vbody_p, where β is a constant in a range of β>0. In the present specification, the inverted signal of any signal A is represented as A*. The input signal $V_{BODYIN}$ may be supplied by a control circuit formed inside the semiconductor device or from the outside of the semiconductor device.

Figure 21:
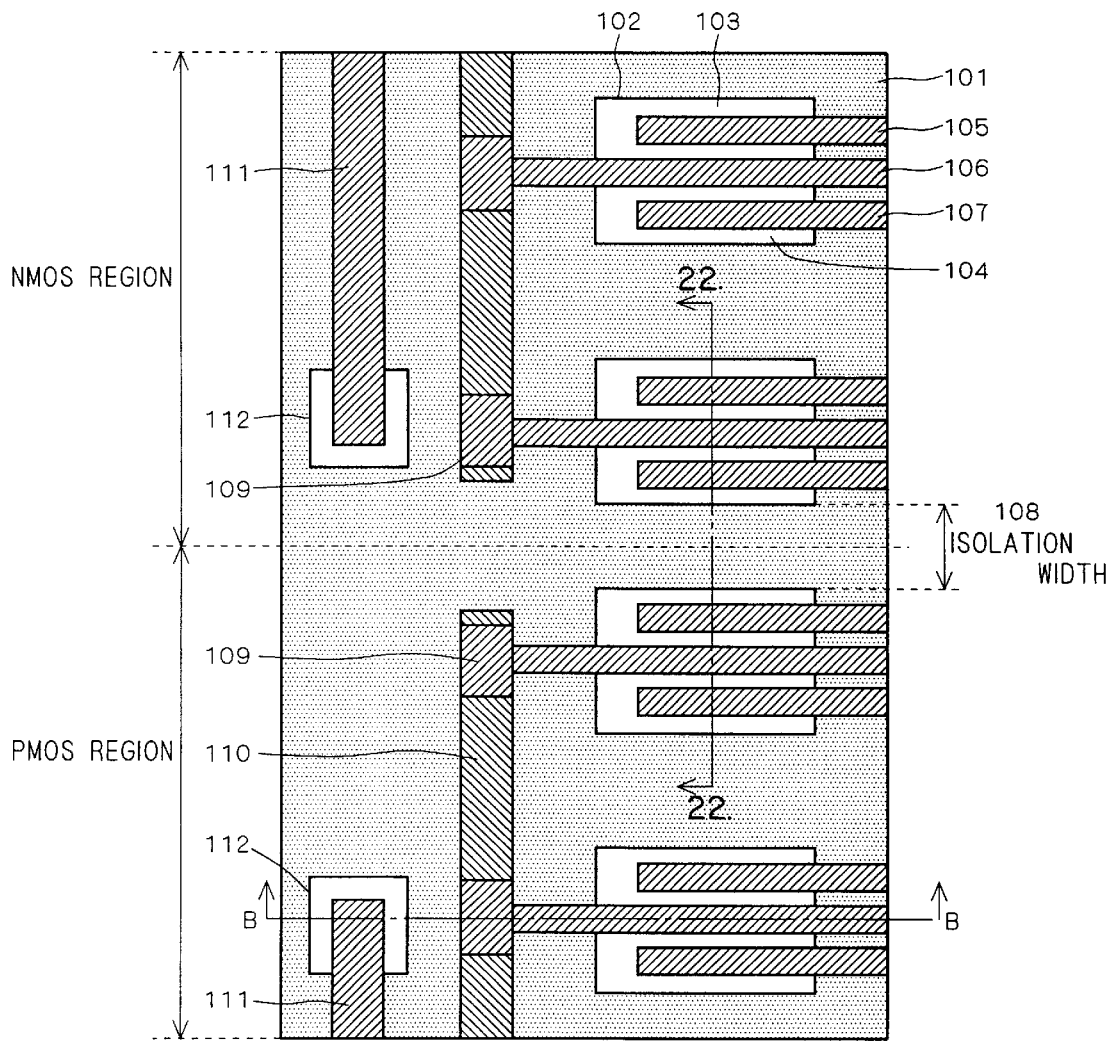
FIG. 21 is a plan view showing the semiconductor device in the background art.
Figure 22:
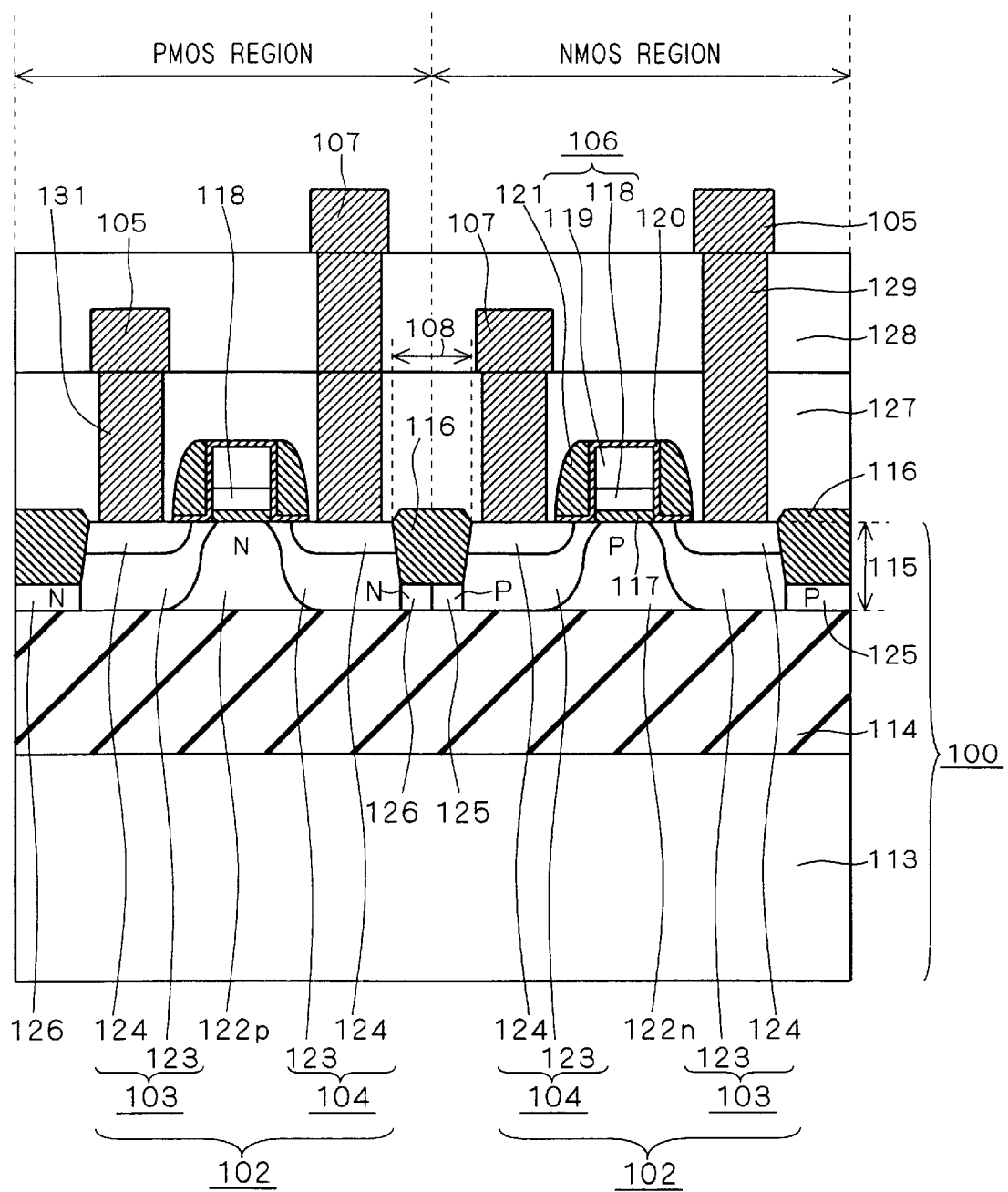
FIG. 22 is a cross section taken along the line A—A off FIG. 21.
Figure 23:
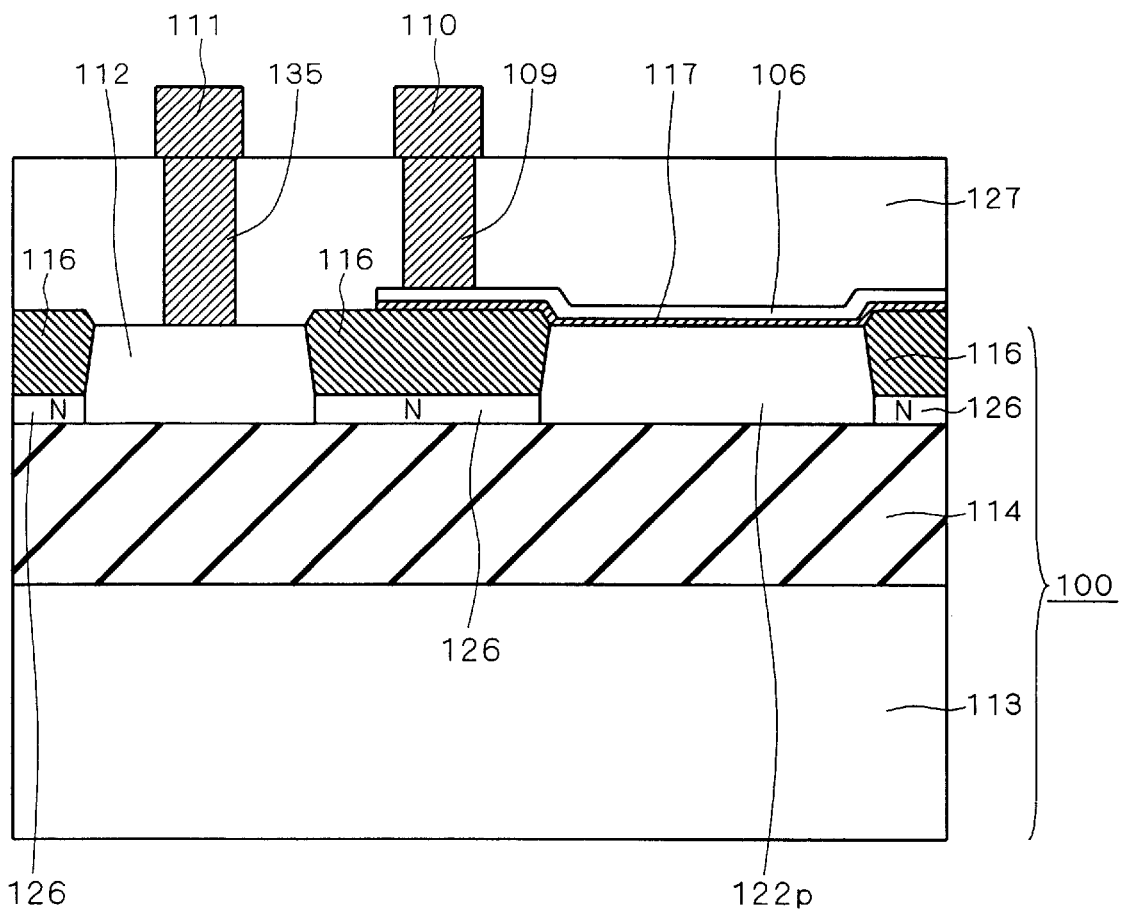
FIG. 23 is a cross section taken along the line B—B off FIG. 21.

As shown in FIGS. 21 to 23, the body potential Vbody_n or Vbody_p is supplied in common to a plurality of MOS transistors of the same conductivity type through the single body contact region 112. Specifically, the body potential Vbody_n outputted by the body bias generation circuit 13 is supplied to the body region 122p of the PMOS transistor through the metal wire 111, the body contact region 112 and the channel stopper 126. Similarly, the body potential Vbody_p outputted by the body bias generation circuit 14 is supplied to the body region 122n of the NMOS transistor through the metal wire 111, the body contact region 112 and the channel stopper 125.

Though not shown, in the semiconductor device of FIG. 1, the supporting substrate 113 immediately below the BOX layer 114 (FIG. 22) is a P-type silicon substrate and its potential is fixed to the ground potential. The technique to fix the potential of the supporting substrate 113 is well known and detailed discussion thereon will be omitted.

Figure 2A:
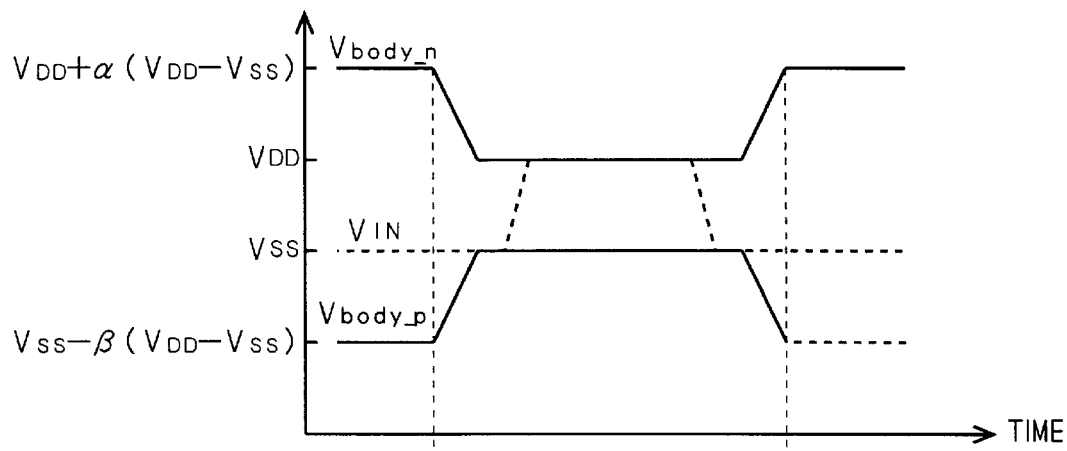
FIGS. 2A and 2B are timing charts showing an operation of the device of FIG. 1.
Figure 2B:
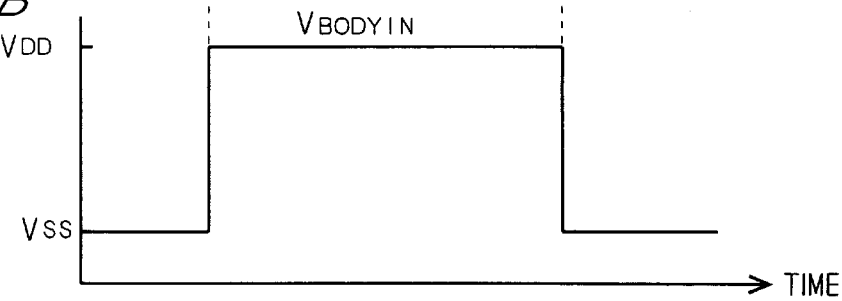

FIGS. 2A and 2B are timing charts showing the relation of the body potentials Vbody_n and Vbody_p, the input signal $V_{BODYIN}$ and the input signal $V_{IN}$. When the integrated circuit including the inverter 12 is in a standby mode, the same potential as the low-side power supply potential $V_{SS}$ is given to the input signal $V_{BODYIN}$. At this time, the potential $V_{DD}+\alpha(V_{DD}-V_{SS})$ is given to the body potential Vbody_n and the potential $V_{SS}-\beta(V_{DD}-V_{SS})$ is given to the body potential Vbody_p. For example, the constant α is set in a range from about 0.1 to 1.0 and the constant β is set in a range from about 0.1 to 1.0. Further, the low-side power supply potential $V_{SS}$ is assumed to be zero.

With the transition of the integrated circuit from the standby mode to the operation mode, the input signal $V_{BODYIN}$ transits from the low-side power supply potential $V_{SS}$ to the high-side power supply potential $V_{DD}$. The body bias generation circuit 13 detects the change in the input signal $V_{BODYIN}$ to thereby change the body potential Vbody_n from the potential $V_{DD}+\alpha(V_{DD}-V_{SS})$ to the high-side power supply potential $V_{DD}$. Similarly, the body bias generation circuit 14 detects the change in the input signal $V^*_{BODYIN}$ to thereby change the body potential Vbody_p from the potential $V_{SS}-\beta(V_{DD}-V_{SS})$ to the low-side power supply potential $V_{SS}$. During the operation mode of the integrated circuit, the input signal $V_{IN}$ is changed and accordingly the output signal $V_{OUT}$ is changed. Specifically, the inverter 12 performs a predetermined operation.

With the transition of the integrated circuit from the operation mode to the standby mode, the input signal $V_{BODYIN}$ returns from the high-side power supply potential $V_{DD}$ to the low-side power supply potential $V_{SS}$. The body bias generation circuit 13 detects the change in the input signal $V_{BODYIN}$ to thereby return the body potential Vbody_n from the high-side power supply potential $V_{DD}$ to the potential $V_{DD}+\alpha(V_{DD}-V_{SS})$. Similarly, the body bias generation circuit 14 detects the change in the input signal $V^*_{BODYIN}$ to thereby return the body potential Vbody_p from the low-side power supply potential $V_{SS}$ to the potential $V_{SS}-\beta(V_{DD}-V_{SS})$.

With this series of operations, during standby of the MOS transistor, the body potential applied to the body region becomes deeper with the source region as a reference than that during operation. Further, in the present specification, it is represented by the expression "body potential is deep" that a body potential is large in the negative direction in the NMOS transistor and large in the positive direction in the PMOS transistor, i.e., generally the reverse bias is large, and conversely it is represented by the expression "body potential is shallow" that the reverse bias is small, in accordance with the conventional practice in this field.

Figure 3:
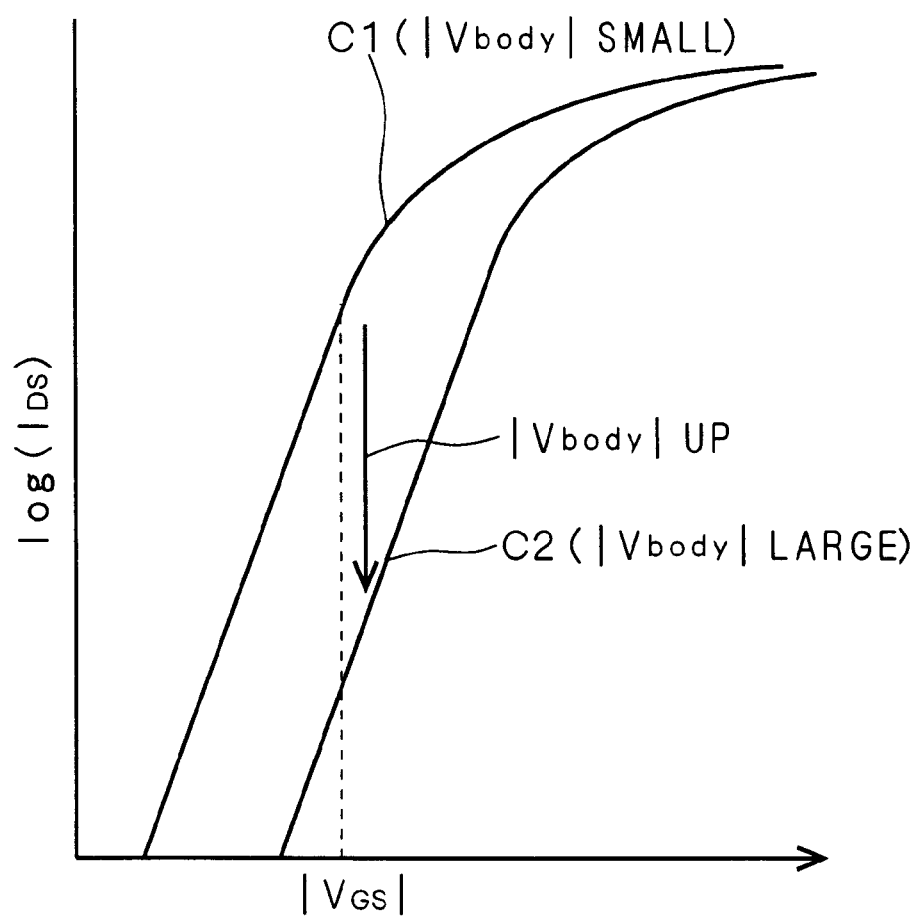
FIG. 3 is an illustration of the operation of the device of FIG. 1.

As shown in the graph of FIG. 3, when the body potential becomes deep, the subthreshold characteristic transits from the curve C1 to the curve C2 and the threshold voltage rises, and therefore a leak current relative to the same gate voltage $V_{GS}$ is largely reduced. Further, during operation, since the zero potential (zero bias) is applied to the body region with the source region as a reference, the threshold voltage is returned to the original value and moreover an operation is achieved with the body potential fixed. Furthermore, in FIG. 3, the vertical axis corresponds to a source-drain current $I_{DS}$ in logarithmic expression and the horizontal axis corresponds to the gate voltage (gate-source voltage) $V_{GS}$.

<1.2. Preferable Example>

When the cross-sectional structure of FIG. 1 taken along the line C—C is set as shown in FIG. 22, when the integrated circuit transits from the standby mode to the operation mode or from the operation mode to the standby mode, there arises variation in reverse bias in the junction formed between the channel stoppers 125 and 126 immediately below the PTI 116 isolating the PMOS region and the NMOS region from each other.

Specifically, during standby, the reverse bias applied to the channel stoppers 125 and 126 is $-(1+\alpha+\beta)V_{DD}$ when $V_{SS}$=0 V. On the other hand, the reverse bias applied during operation is $-V_{DD}$. Therefore, the amount of variation in reverse bias between the standby mode and the operation mode is $-(\alpha+\beta)V_{DD}$. This variation in reverse bias can be assumed to cause noise due to the junction capacitance created between the channel stoppers 125 and 126 and the source/drain regions 103 and 104, and generate a considerable amount of leak current when the isolation width 108 is small.

This problem can be solved by setting the cross-sectional structure of FIG. 1 taken along the line C—C as shown in FIG. 4. In the following figures including FIG. 4, element portions identical to or corresponding to (having the same function as) those of the background-art device shown in FIGS. 20 to 23 are represented by the same reference signs and detailed description thereon will be omitted. In the structure of FIG. 4, the isolation between the PMOS region and the NMOS region is achieved by the FTI 150. Therefore, it is possible to further reduce the noise and the leak current while keeping high integration of the integrated circuit with the isolation width 108 made narrower.

<1.3. Another Example of Integrated Circuit>

Figure 5:
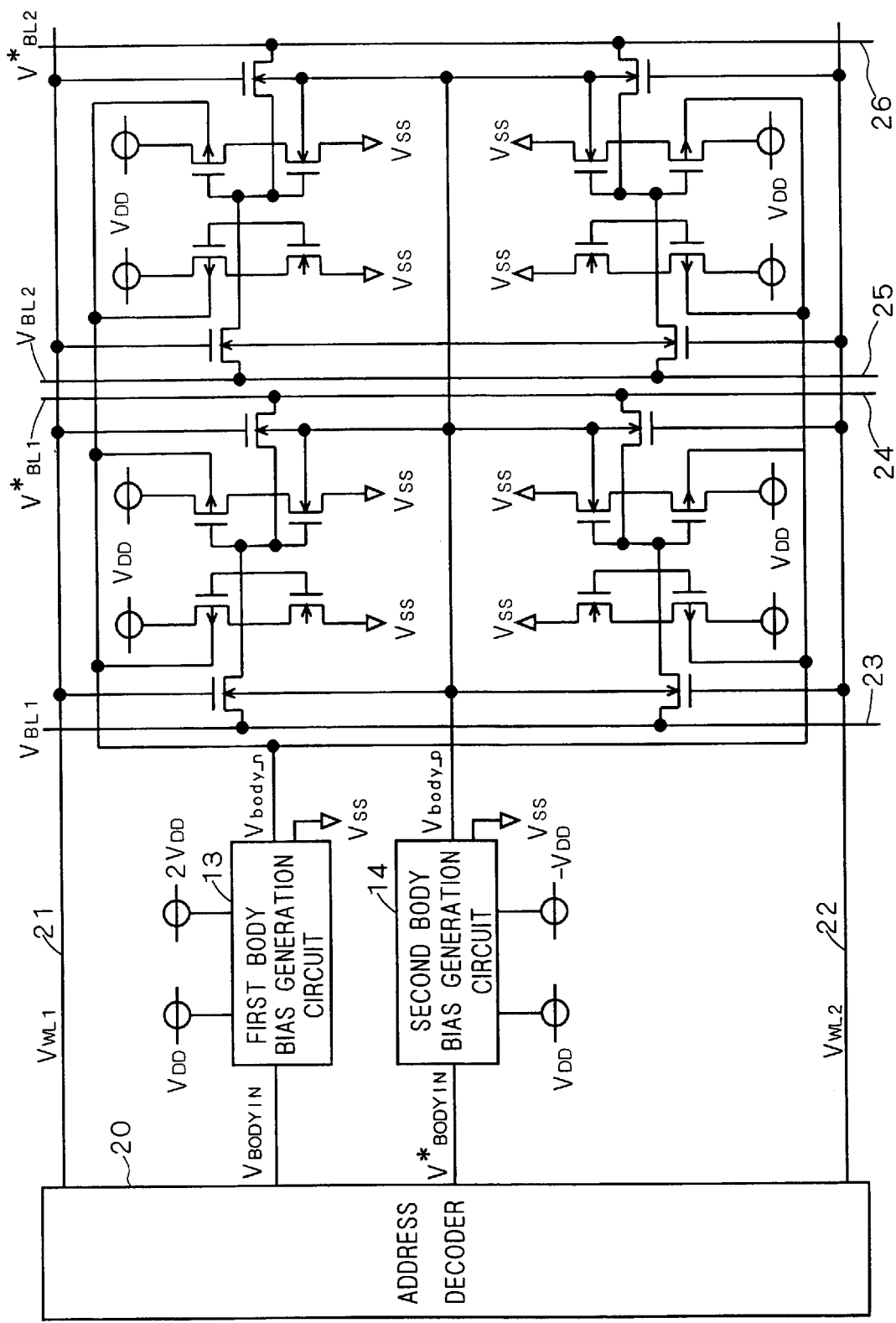
FIG. 5 is a cross section showing another example of the device in accordance with the first preferred embodiment.

Though FIG. 1 shows the case where the integrated circuit includes the inverter 12, there may be another constitution of the semiconductor device comprising an SRAM (static RAM) or a DRAM (dynamic RAM) as an integrated circuit. FIG. 5 is a circuit diagram showing part of a memory cell array and body bias generation circuits for generating the body potential of MOS transistors included in the memory cell array in a case where the integrated circuit is an SRAM. As part of the memory cell array, shown are four memory cells connected to two word lines 21 and 22 and two pairs of bit lines 23, 24, 25 and 26.

In the memory cell of the SRAM, two CMOS inverters are cross-coupled and each gate electrode is connected to the bit line through an access transistor. Therefore, one memory cell comprises two PMOS transistors and four NMOS transistors. The body potential of each NMOS transistor is fixed to the body potential Vbody_n supplied by the body bias generation circuit 13, and the body potential of each PMOS transistor is fixed to the body potential Vbody_p supplied by the body bias generation circuit 14.

Figure 6:
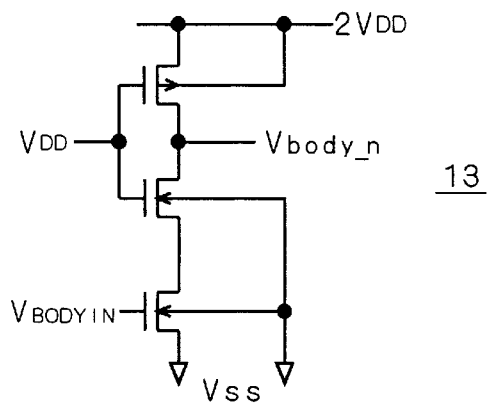
FIGS. 6 and 7 are circuit diagrams each showing a body bias generation circuit in accordance with the first preferred embodiment.
Figure 7:
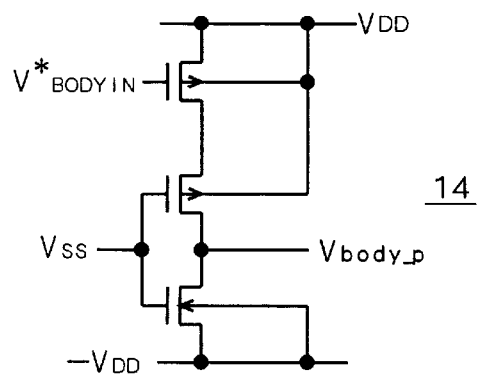

In the body bias generation circuits 13 and 14 of FIG. 5, α and β of the body bias generation circuits 13 and 14 shown in FIG. 1 are each set to 1. The internal structures of the body bias generation circuits 13 and 14 of FIG. 5 are shown in e.g., the circuit diagrams of FIGS. 6 and 7, respectively. The input signals $V_{BODYIN}$ and $V^*_{BODYIN}$ are supplied together with signals $V_{WL1}$ and $V_{WL2}$ transmitted to the word lines 21 and 22, respectively, by an address decoder 20 (FIG. 5) and changed in synchronization with the signals $V_{WL1}$ and $V_{WL2}$.

Figure 8:
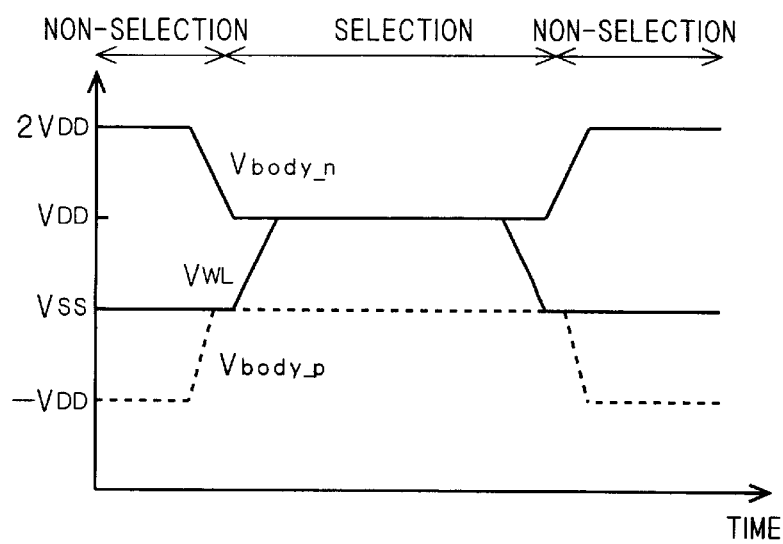
FIG. 8 is a timing chart showing an operation of the device of FIG. 5.

FIG. 8 is a timing chart showing the variation in the body potentials Vbody_n and Vbody_p and a signal $V_{WL}$ on one of the word lines 21 and 22. When the word line is not selected (i.e., the SRAM is in a standby mode), the body potential Vbody_n is fixed to $2V_{DD}$ and the body potential Vbody_p is fixed to $-V_{DD}$. On the other hand, when the word line is selected (i.e., the SRAM is in an operation mode), the body potential Vbody_n is fixed to $V_{DD}$ and the body potential Vbody_p is fixed to $V_{SS}$. By controlling the timing so that the transition in the signal on the word line may start after completing the transition in the body potential, it is possible to further reduce the leak current.

Figure 9:
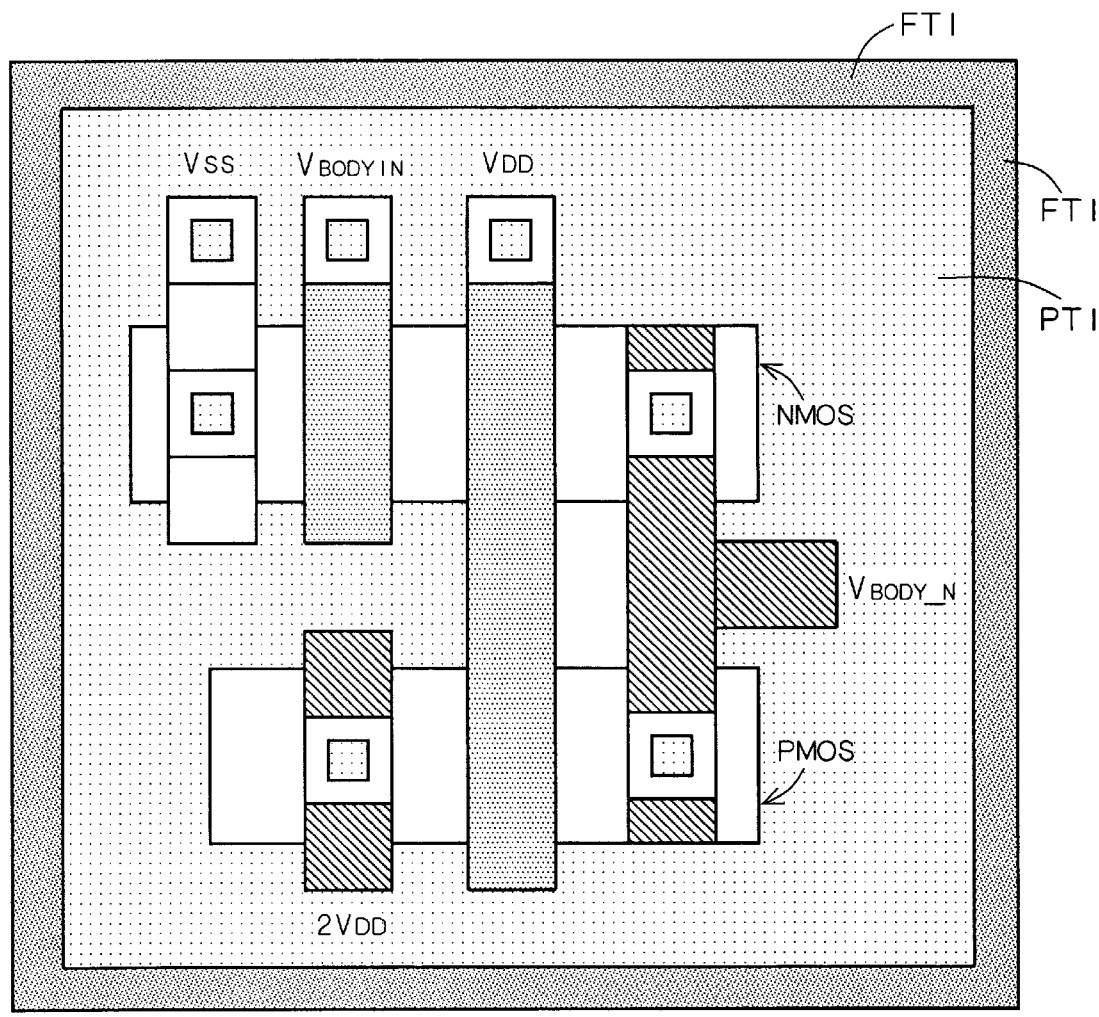
FIG. 9 is a plan view showing a body bias generation circuit in accordance with the first preferred embodiment.

The MOS transistors constituting the memory cell are formed in the main surface of the SOI substrate 100 and isolated form one another by the PTI 116, and it is further preferable that (1) the PMOS transistor and the NMOS transistor included in the body bias generation circuits 13 and 14 should be isolated from each other by the FTI 150 and (b) the adjacent MOS transistors between the memory cell and the body bias generation circuits 13 and 14 should be isolated from each other by the FTI 150, in terms of reduction in leak current. FIG. 9 is a plan view showing an exemplary pair of body bias generation circuits 13 and 14 based on the condition (b).

Though it is not bad to satisfy only one of the above conditions (a) and (b), it is preferable to satisfy both. According to the above condition (a) or (b), at least one pair of PMOS transistor and NMOS transistor are isolated from each other by the FTI 150 and therefore the isolation width 108 is reduced as compared with the case of isolation by the PTI 116, to thereby achieve an effect of further reducing the area of the memory cell.

<1.4. Comparison with Well-Known Technique>

The above-mentioned document 1 discloses, in its FIG. 1, (1) MOS transistors formed in a main surface of an SOI substrate and isolated from one another by PTIs, (2) a body contact region for fixing a body potential through an SOI layer existing immediately below the PTI, (3) a technique to change a body voltage applied to a well contact of an NMOS transistor between during active state (operation) and during standby and (4) a structure in which a PMOS region and an NMOS region are isolated from each other by an FTI. The document 1, however, neither discloses nor suggests a body bias generation circuit. Further, the document 1 discloses (5) a technique to form a well in the SOI layer but does not disclose a technique to form a channel stopper immediately below the PTI.

<2. The First Preferred embodiment>

In a semiconductor device in accordance with the second preferred embodiment of the present invention, a plurality of MOS transistors constituting the integrated circuit are formed in the SOI substrate and isolated from one another by the PTIs and a body bias generation circuit is provided for changing the magnitude of a supply current in accordance with the magnitude of a body current. That suppresses the leak current and effectively suppresses accumulation of electric charges in the body region, and therefore the problems such as variation in threshold voltage and delay of circuit operation can be solved. Further, it is preferable that the potential of the semiconductor substrate immediately below the BOX layer should be fixed to the ground potential also in the second preferred embodiment.

Figure 10:
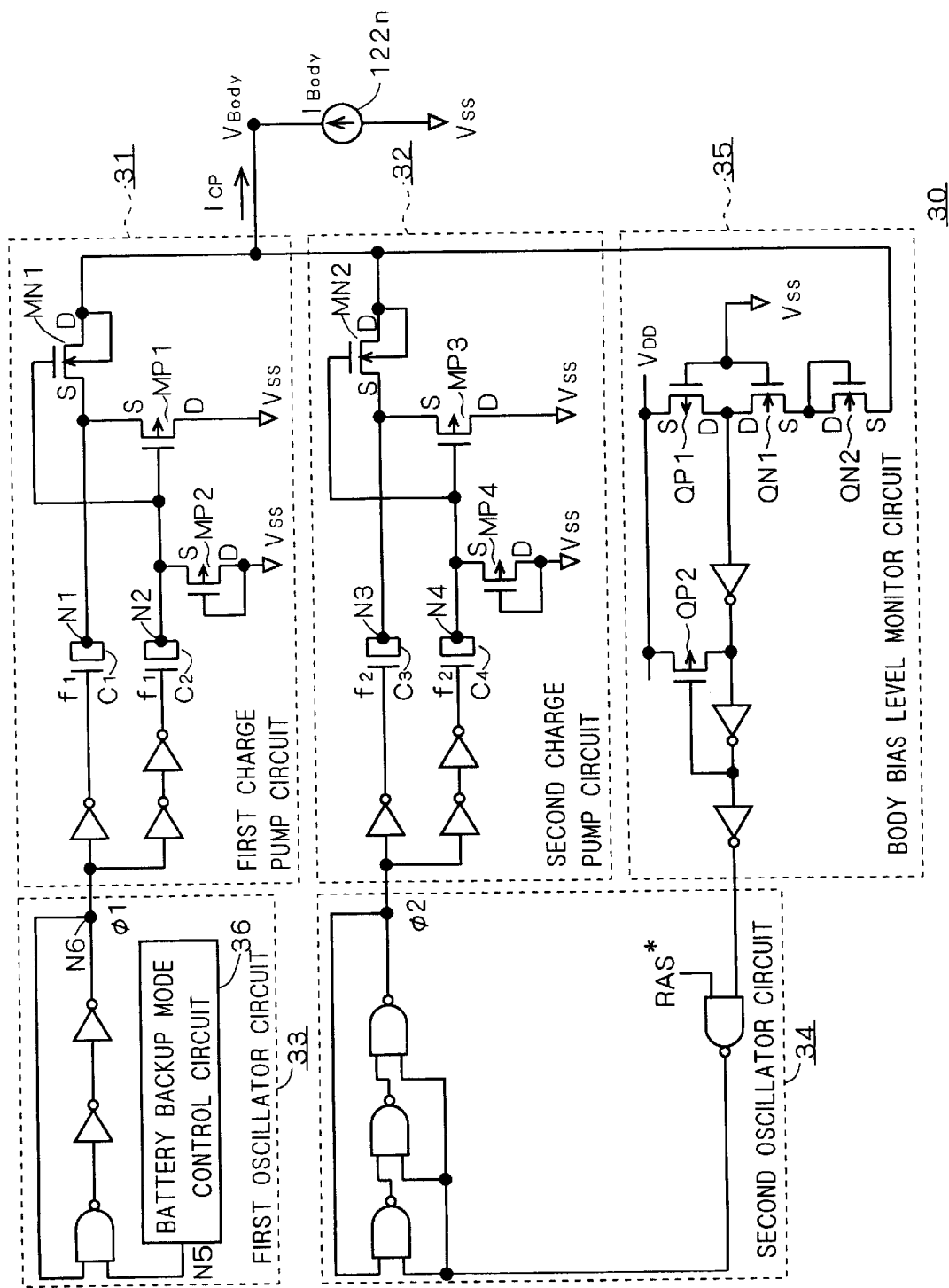
FIG. 10 is a circuit diagram showing a body bias generation circuit in accordance with a second preferred embodiment.

FIG. 10 is a circuit diagram showing a structure of a body bias generation circuit in accordance with the second preferred embodiment. This body bias generation circuit 30 is configured to supply the body potential Vbody_n to the P-type body region 122n of the NMOS transistor included in the DRAM which is an integrated circuit provided in the semiconductor device. Similarly, there may be another circuit configuration to supply the body potential Vbody_p to the N-type body region 122p, though description thereon will be omitted below. The body bias generation circuit 30 comprises two charge pump circuits 31 and 32, two oscillator circuits 33 and 34 and a body bias level monitor circuit 35.

The oscillator circuit 33 comprises a ring oscillator and a battery backup mode control circuit 36, and selectively outputs and stops a clock Φ1 to a node N6 on the basis of a control signal outputted from the battery backup mode control circuit 36 to the node N5. The oscillator circuit 34 comprises a ring oscillator and an NAND element serving as a logic switch, and selectively outputs and stops a clock Φ2 in response to a row address strobe signal RAS* and a control signal outputted from the body bias level monitor circuit 35.

Though not shown, the body bias generation circuit 30 is supplied with the high-side power supply potential $V_{DD}$ and the low-side power supply potential $V_{SS}$ as the power supply potential. Therefore, output signals of inverters inputted to respective one ends of four MOS capacitive elements C1 to C4 provided in the charge pump circuits 31 and 32 transit between the low-side power supply potential $V_{SS}$ and the high-side power supply potential $V_{DD}$. The MOS capacitive elements C1 and C2 have the same capacitance and the MOS capacitive elements C3 and C4 have the same capacitance.

The charge pump circuit 31 operates in synchronization with the clock Φ1. When the clock Φ1 is in a low level, the potential of a node N2 becomes $|V_{TP}|-V_{DD}$ where $V_{TP}$ represents a threshold voltage of a PMOS transistor MP2. A PMOS transistor MP1 is turned on and a node N1 is clamped to 0 V. Next, the clock Φ1 transits to a high level, the potential of the node N2 is clamped to the potential $|V_{TP}|$, and the potential of the node N1 becomes $-V_{DD}$ for a moment through capacitive coupling and thereafter electrons are gradually supplied to the body region 122n through an NMOS transistor MN1. By repeating application of the clock Φ1, the electric charges are supplied as above and finally the supply of the electric charges is stopped when the body potential reaches $-V_{DD}$. When the electric charges are supplied to the body region 122n, the potential at the gate electrode of the NMOS transistor MN1 takes a positive value which is sufficiently large relative to the potential at the node N1 and the potential at the body region 122n.

Therefore, the body potential Vbody becomes almost $-V_{DD}$ with little effect by the threshold voltage of the NMOS transistor MN1.

The charge pump circuit 32 also supplies the electric charges to the body region 122n, like the charge pump circuit 31, in synchronization with the clock Φ2. The two charge pump circuits 31 and 32 are different from each other in capability of supplying the electric charges to the body region 122n, i.e., magnitude of the supply current $I_{CP}$. For this reason, the frequency f2 of the clock Φ2 is set larger than the frequency f1 of the clock Φ1, and the capacity of the MOS capacitive elements C3 and C4 is set larger than that of the MOS capacitive elements C1 and C2. The frequencies f1 an f2 are set by the ring oscillators provided in the oscillator circuits 33 and 34. Since the supply current $I_{CP}$ is in proportion to $V_{DD} \cdot C \cdot f$ where C represents the capacitance of the operating MOS capacitive element and f represents the frequency of the operating clock, larger supply current $I_{CP}$ is obtained as the capacitance C and the frequency f become larger.

The charge pump circuit 31, which operates at low power, is controlled to always operate and the charge pump circuit 32, which needs high power, is controlled to operate only when the supply current $I_{CP}$ of large magnitude is needed. In the case of FIG. 10, when the row address strobe signal RAS* becomes active, that is, the DRAM is accessed, the clock Φ2 oscillates and the charge pump circuit 32 thereby operates.

The supply current $I_{CP}$ of large magnitude is thereby supplied so as to complement the body current Ibody of large magnitude generated when the DRAM is accessed. That can solve the problems in the background-art device that the substrate current is generated by the electric charges accumulated in the body region and there may be a case, depending on the operating frequency, where noise is superimposed on the circuit signal and the circuit operation becomes slower due to variation in threshold voltage caused by the substrate current when the DRAM is in the operation mode.

Further, even when the body potential of the body region 122p becomes shallow for some reason at power-on or during operation of the circuit, the clock Φ2 oscillates by the action of the body bias level monitor circuit 35, and the supply current $I_{CP}$ of large magnitude is thereby supplied. When the DRAM is in the standby mode and the body potential is sufficiently deep, only the charge pump circuit 31 operates. Therefore, it is possible to reduce the power consumption of the body bias generation circuit 30 to a low level.

The body bias level monitor circuit 35 operates as follows. Assuming the threshold voltage of NMOS transistors QN1 and QN2 in a case of no substrate bias effect to be $V_{TN}$, the monitored potential level (monitored level) becomes $-2V_{TN}$. When the body potential Vbody becomes shallower than the monitored level, MOS transistors QP1 and QP2 are turned off. As a result, the potential at the drain of the NMOS transistor QN1 is brought into a high level and oscillation of the clock Φ2 is thereby started. The PMOS transistor QP2 is interposed to shape the waveform of the output signal from an inverter element provided in the body bias level monitor circuit 35. Further, in order to reduce the current unnecessarily flowing to the body region 122p for monitoring, it is desirable to set the ratio W/L of the gate width to the gate length small, where W represents the gate width and L represents the gate length.

Figure 11:
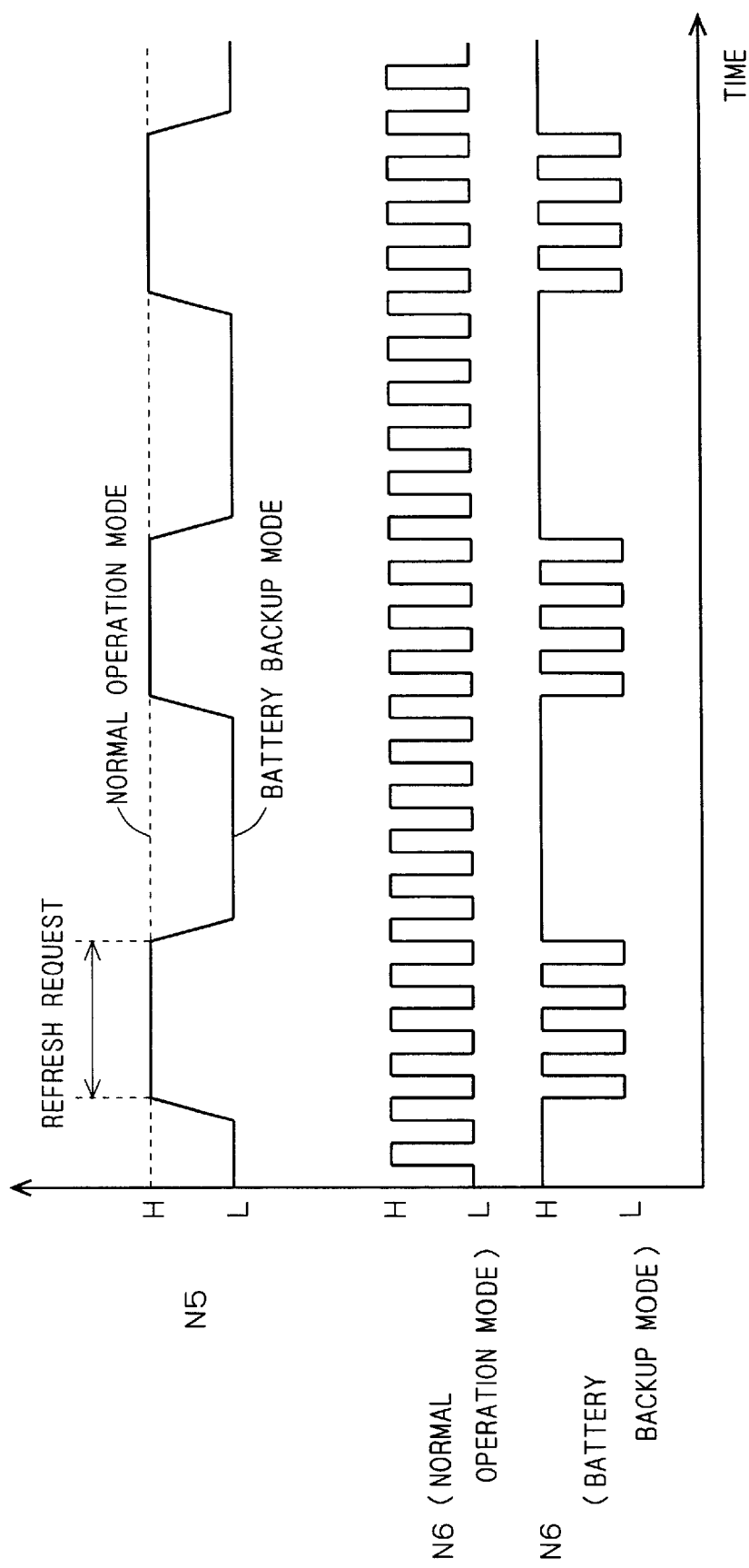
FIG. 11 is a timing chart showing an operation of the circuit of FIG. 10.

The battery backup mode control circuit 36 provided in the oscillator circuit 33 judges whether the operating mode of the DRAM is a normal operation mode or a battery backup mode, and outputs different control signals, depending on the judgment result, to the node N5. FIG. 11 is a timing chart showing this operation. When the operating mode is the normal operation mode, the battery backup mode control circuit 36 always outputs a high-level signal as the control signal. As a result, the oscillating clock Φ1 is always outputted to the node N6.

When the operating mode is the battery backup mode, the battery backup mode control circuit 36 outputs the high-level signal as the control signal only during a period while a refresh request signal is inputted to the DRAM. As a result, the oscillating clock Φ1 is outputted to the node N6 only when the refresh is requested. Therefore, it is possible to further reduce the power consumption when the operating mode is the battery backup mode.

When the speed of removing the electric charges accumulated in the body region is slower as compared with the switching speed of the gate electrode, it is assumed that an influence is produced on the operation of the integrated circuit. Then, for example, by setting the oscillation frequencies f1 and f2 of the ring oscillator larger than the operating frequency (the frequency of a not-shown system clock supplied to the integrated circuit) of the integrated circuit to be supplied with the body potential in consideration of the delay time of the body bias generation circuit 30, the above influence can be removed. In the device of this preferred embodiment, since the oscillator circuits 33 and 34 for generating clocks independent of the system clock are provided, it is possible to set the operating frequency of the body bias generation circuit 30 separately from the operating frequency of the integrated circuit.

Further, the body bias generation circuit can have a constitution in which, in general, M ($\geq 2$) pairs of the oscillator circuit and the charge pump circuit are provided, to supply the body region with the supply current of M levels in magnitude. Since it is possible to control the magnitude of the supply current to a more suitable one in accordance with the magnitude of the body current by setting M larger, the current consumption can be further reduced. The body bias generation circuit 30 of FIG. 10 corresponds to a case of M=2.

<3. The First Preferred embodiment>

In a semiconductor device in accordance with the third preferred embodiment of the present invention, a plurality of MOS transistors included in an integrated circuit having a plurality of function blocks are formed in the SOI substrate, and each function block is fixed to body potentials different between during standby and during operation and at least one pair of adjacent function blocks are isolated from each other by the FTI. The MOS transistors belonging to one function block are isolated from one another mainly by the PTIs.

Therefore, it is possible to optimize the body potential in accordance with an operation of each function block, and power consumption of the whole semiconductor device can be thereby effectively reduced. Further, it is possible to reduce the leak current between the function blocks while keeping the area of a chip small. Furthermore, also in the third preferred embodiment, it is preferable that the potential of the semiconductor substrate immediately below the BOX layer should be fixed to the ground potential.

Figure 12:
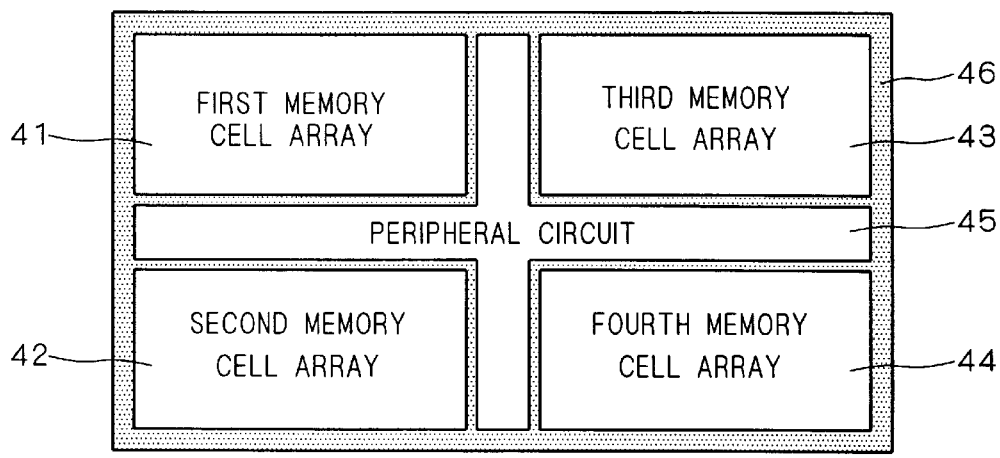
FIGS. 12 and 13 are plan views each illustrating a semiconductor device in accordance with a third preferred embodiment.

FIG. 12 is a plan view showing an exemplary semiconductor device in accordance with the third preferred embodiment. In this device, the integrated circuit comprises DRAM, SRAM or EEPROM memory cell arrays 41 to 44, and a peripheral circuit 45, as a plurality of function blocks. The function blocks are isolated from one another by FTIs 46.

The four memory cell arrays 41 to 44 are supplied with the body potential by a single body bias generation circuit (not shown). Therefore, the memory cell arrays 41 to 44 are fixed to the same body potential in accordance with the state of the integrated circuit. On the other hand, the peripheral circuit 45 is supplied with the body potential by another body bias generation circuit. The peripheral circuit 45 is a function block for specifying addresses of the memory cell arrays 41 to 44 and controlling read/write of data.

The peripheral circuit 45, which performs the function different from that of the memory cell arrays 41 to 44, is fixed to the body potential different from that of the memory cell arrays 41 to 44 by the different body bias generation circuit. As the body bias generation circuit used for the memory cell arrays 41 to 44 and the peripheral circuit 45, for example, the body bias generation circuits 13 and 14 shown in FIGS. 6 and 7 can be used.

Though not shown, the peripheral circuit 45 is further divided into sub-function blocks such as a decoder, a step-up transformer circuit, a step-down transformer circuit and a sense amplifier. These sub-function blocks may be attended by different body bias generation circuits respectively. Further, a plurality of MOS transistors belonging to one function block may be isolated from one another by the FTIs, instead of the PTIs. Furthermore, there may be a case where only some adjacent function blocks are isolated from one another by FTIs and the other are insolated by the PTIs, instead of the case where all the function blocks are isolated from one another by the FTIs 46.

Further, there may be another configuration of the semiconductor device where some groups of function blocks each of which includes single or plural function blocks are individually attended by the body bias generation circuits, instead of the configuration of the semiconductor device where each of the function blocks is attended by corresponding one of the body bias generation circuits. Specifically, there may be a configuration, in general, where N ($\geq$2) function blocks are attended by L (2$\leq$L$\leq$N) body bias generation circuits.

Figure 13:
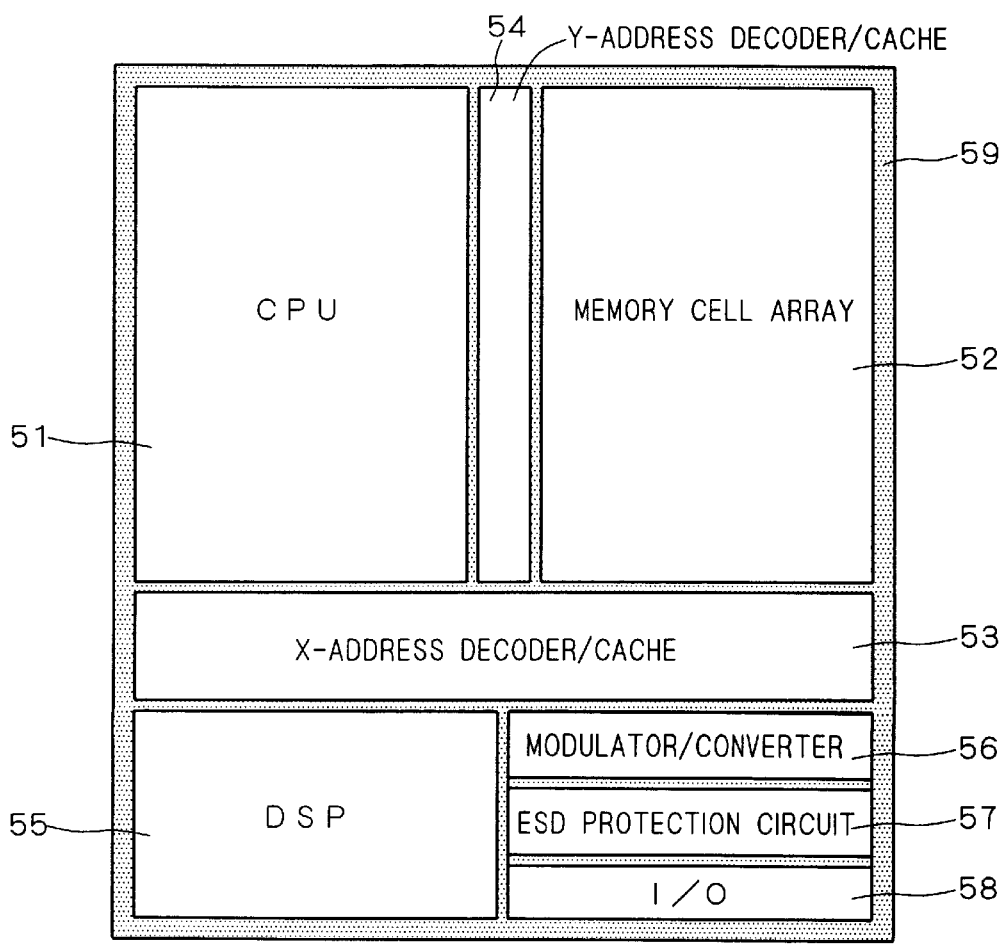

FIG. 13 is a plan view showing another exemplary semiconductor device in accordance with the third preferred embodiment. In this device, the integrated circuit, configured as a system LSI, comprises a CPU 51, a memory cell array 52, an X-address decoder/cache 53, a Y-address decoder/cache 54, a DSP (Digital Signal Processor) 55, a modulator/converter 56, an ESD (Electro-Static-Discharge) protection circuit 57 and an input/output interface 58, as a plurality of function blocks. These function blocks are isolated from one another by FTIs 59.

A plurality of MOS transistors belonging to each function block are isolated from one another mainly by the PTIs. The input/output interface 58 performs functions of outputting a signal to the outside of the semiconductor device and receiving a signal from the outside through a cable (metal wire or optical fiber) or radio. The ESD protection circuit 57 is a circuit for protecting the semiconductor chip from electrostatic discharge. The modulator/converter 56 performs a function of modulating and demodulating the signal transmitted through radio or cable. The signal from/to the outside are transmitted in an enciphered/coded form of publicly-known communication system, and the demodulated signal is to be processed inside the semiconductor chip. The cipher or code is superimposed on the signal to be processed, and transmitted.

The X-address decoder/cache 53 performs functions of specifying the address of the memory cell array 52 to control read/write of data and storing the data to efficiently transmit the data between the CPU 51 or the DSP 55 whose operating frequency is fast and the memory cell array 52 whose operating frequency is slow. The memory cell array 52 is a function block for storing the data. The CPU 51 is a function block for processing the data. The DSP 55 is a function block for batch-processing a plurality of digital data.

These function blocks, whose operating frequencies (i.e., frequencies of the system clocks) are different from one another, comprise respective body potential generation circuits operating at different frequencies, for generating different potentials. As the body bias generation circuit used for the function blocks of FIG. 13, for example, the body bias generation circuit 30 shown in FIG. 10 can be used.

Some of a plurality of MOS transistors belonging to one function block may be isolated from one another by the FTIs, instead of the PTIs. Further, there may be a case where only some adjacent function blocks are isolated from one another by FTIs and the other are insolated by the PTIs, instead of the case where all the function blocks are isolated from one another by the FTIs 59. Furthermore, like the semiconductor device of FIG. 12, there may be another configuration of the semiconductor device where some groups of function blocks each of which includes single or plural function blocks are individually attended by the body bias generation circuits, instead of the configuration where each of the function blocks is attended by corresponding one of the body bias generation circuits.

<4. The Fourth Preferred embodiment>

Figure 14:
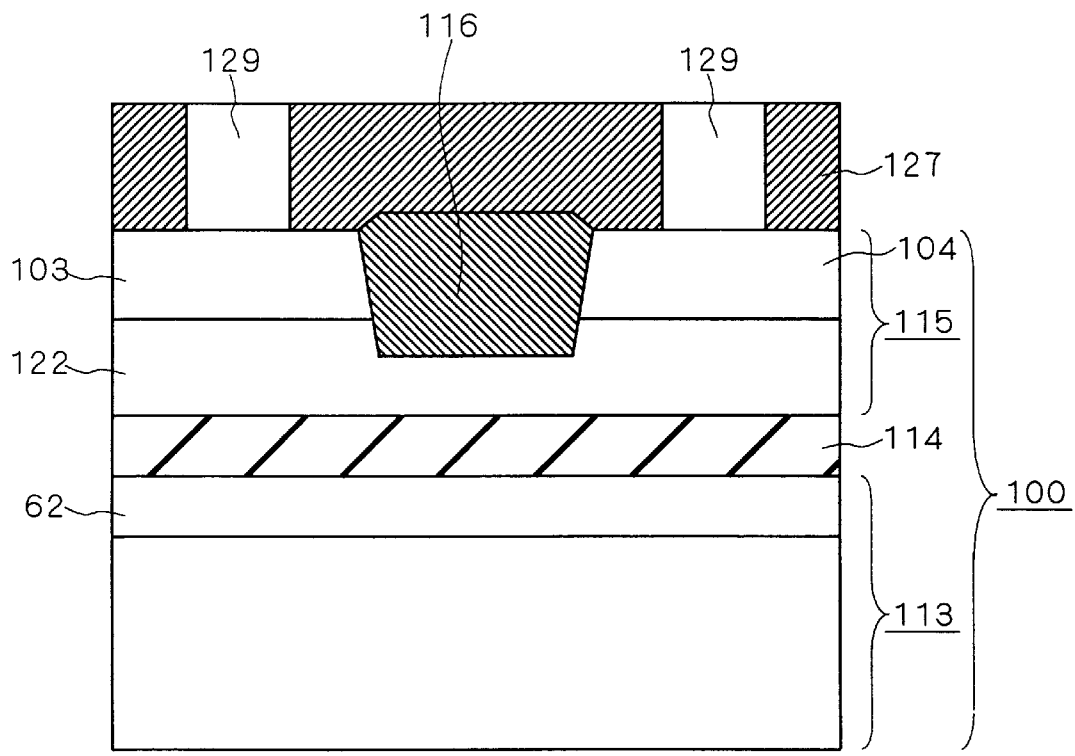
FIGS. 14 to 16 are cross sections each illustrating a semiconductor device in accordance with a fourth preferred embodiment.
Figure 15:
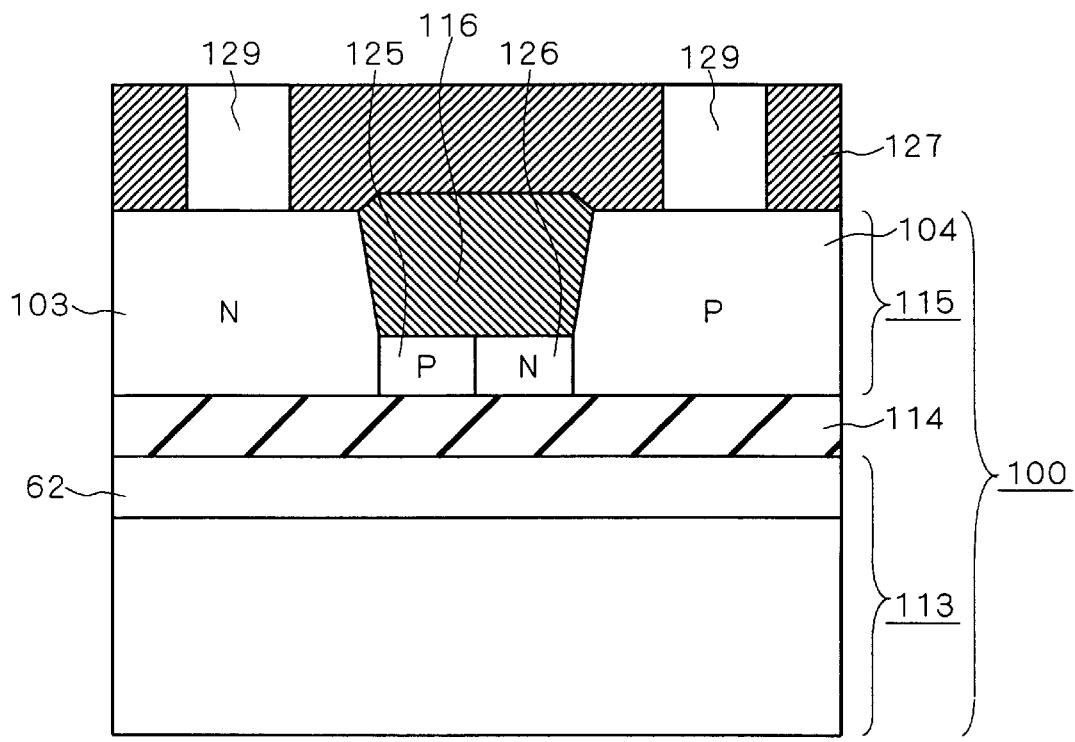

In the first to third preferred embodiments, the semiconductor device comprises the SOI substrate 100 and preferably the semiconductor supporting substrate positioned immediately below the BOX layer is fixed to the ground potential. There may be another preferable case, as shown in FIGS. 14 and 15, where a bottom layer 62 which is an impurity diffusion layer of at least one-layered structure is formed in the main surface of the supporting substrate 113 being in contact with the BOX layer 114 in accordance with the configuration of the integrated circuit and its potential is fixed. That makes it possible to control the potential distribution in the body region 122 or the channel stoppers 125 and 126 immediately below the PTI 116, and therefore, it is possible to further reduce the leak current flowing the channel stoppers 125 and 126 immediately below the PTI 116.

Still preferably, a bottom potential generation circuit having the same constitution as the body bias generation circuit is provided so that the potential of the bottom layer 62 may change in synchronization with the body potential. That makes it possible to further effectively suppress the leak current. The bottom potential generation circuit is preferably formed in the SOI layer 115 together with the integrated circuit, like the body bias generation circuit. Alternatively, there may be a constitution, instead of forming the bottom potential generation circuit, where the body potential outputted from the body bias generation circuit is supplied to the bottom layer 62 as well as the body region 122, and this simplifies the constitution of the semiconductor device.

Figure 16:
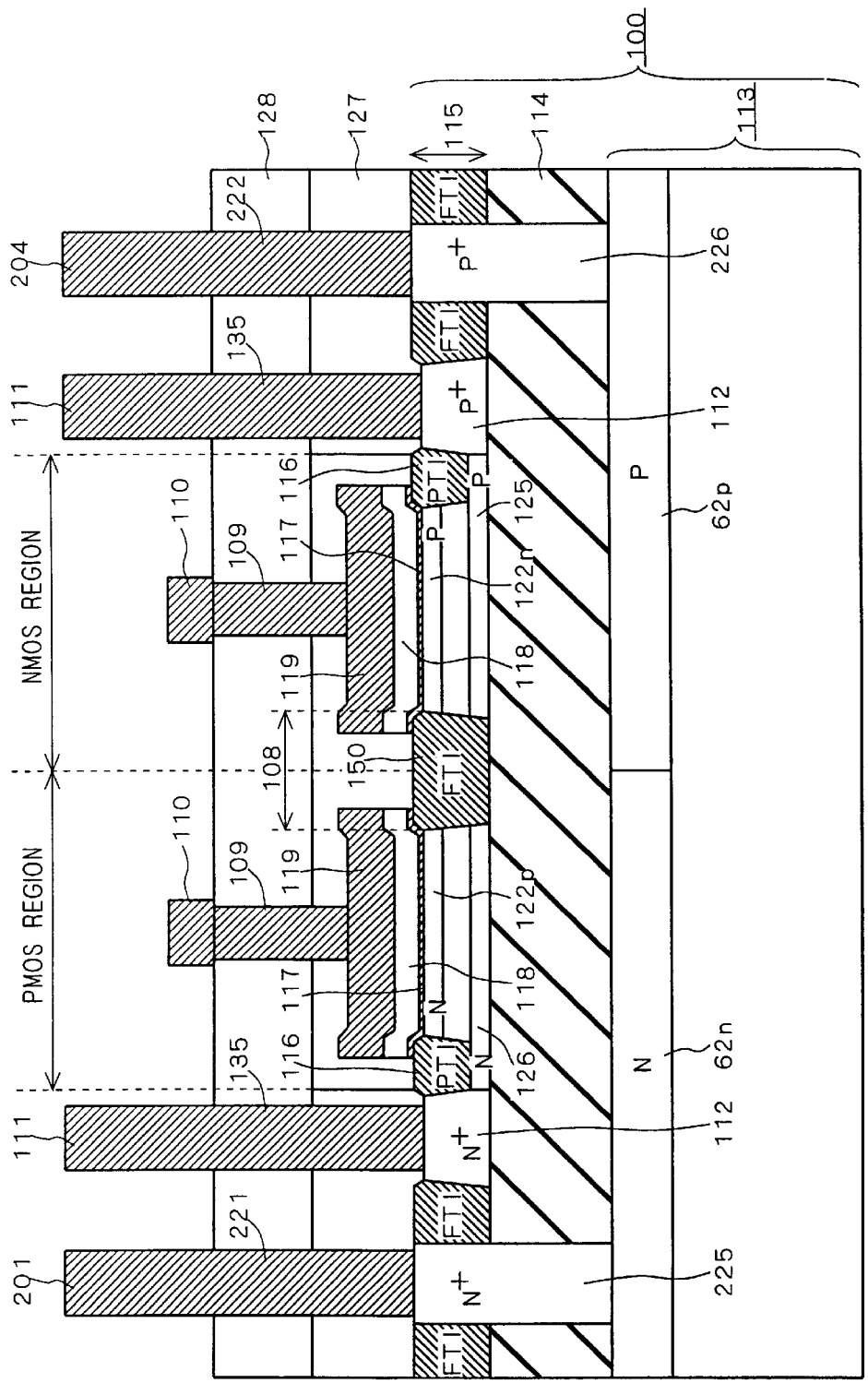
Figure 20:
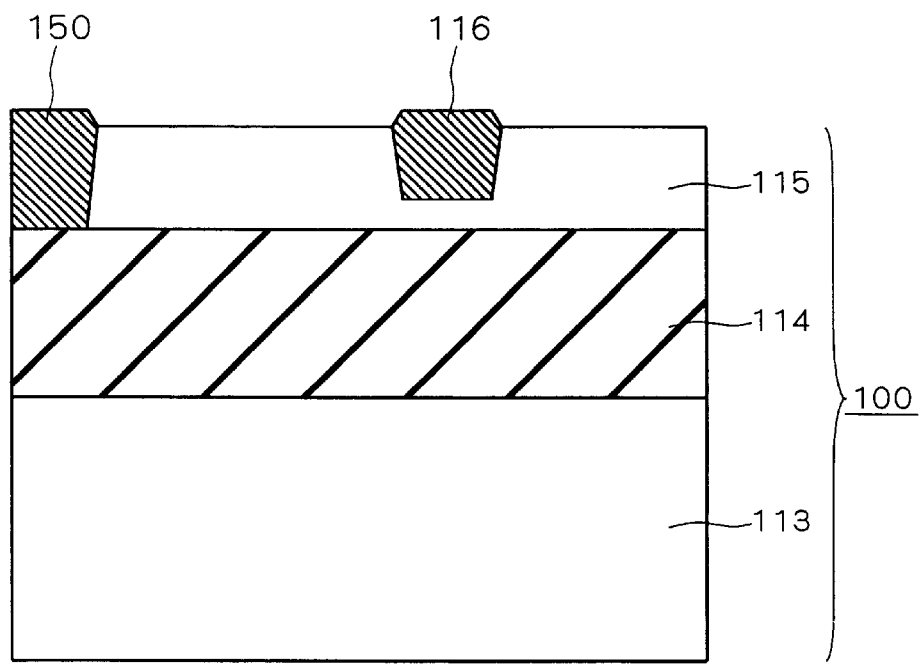
FIG. 20 is a cross section showing a semiconductor device in the background art.

FIG. 16 is a cross section of the semiconductor device, illustrating a constitution to supply the bottom potential to the bottom layer 62. Two kinds of potentials generated by the not-shown bottom potential generation circuit or the body bias generation circuit is supplied to the bottom layers 62n and 62p through metal wires 201 and 204, contact plugs 221 and 222 and bottom contact layers 225 and 226, respectively.

FIGS. 17 and 18 are circuit diagrams illustrating the bottom potential generation circuits. FIGS. 19A and 19B are timing charts showing the change in the bottom potentials Vbottom__n and Vbottom__p generated by these circuits. In the case shown in FIGS. 17, 18, 19A and 19B, the bottom potentials Vbottom__n and Vbottom__p are generated equally to the body potentials Vbody__n and Vbody__p on the basis of the input signal $V_{BODYIN}$. Therefore, as discussed above, the body bias generation circuit can have the function of the bottom potential generation circuit. In general, the bottom potential and the body potential may have different values.

<5. Variations>

(1) Though the case where the BOX layer 114 made of a silicon oxide is formed as the buried insulating film is shown in the above preferred embodiments, in general, the material for the buried insulating film has only to be insulative one, and for example, silicon oxy-nitride, silicon nitride, SiOF, SiOC or hollow structure (filled with insulative gas such as helium, argon or nitrogen) may be used.

(2) Though the case where the integrated circuit is formed in the main surface of the SOI substrate is shown in the above preferred embodiments, in general, the integrated circuit may be formed in the main surface of the semiconductor substrate as a bulk semiconductor circuit. Further, it is preferable to use the SOI substrate in terms of possibility of isolation using the FTI.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   at least one MOS transistor formed in a main surface of a semiconductor substrate, being a constituent element of a circuit operating in synchronization with a system clock; and
   a body bias generation circuit configured to apply a body potential to a body region of said at least one MOS transistor at a different level including a potential of reverse bias relative to a source region in response to a signal of said circuit operating in synchronization with said system clock.

2. The semiconductor device according to claim 1, wherein
   said body bias generation circuit selectively applies one of said potential of reverse bias and a potential of zero bias relative to said source region to said body region as said body potential.

3. The semiconductor device according to claim 1, wherein
   said body bias generation circuit selectively supplies said body region with one of M (M≧2) supply currents of different magnitudes.

4. The semiconductor device according to claim 3, wherein said body bias generation circuit comprises:
   M oscillator circuits configured to generate M clocks having different frequencies; and
   M charge pump circuits configured to intermittently supply said body region with currents individually in synchronization with said M clocks.

5. The semiconductor device according to claim 4, wherein
   said body bias generation circuit comprises a monitor circuit configured to compare a difference between a potential of said body region and that of said source region with a reference value and to output a comparison result, and
   one of said M oscillator circuits which generates a clock having the highest frequency so operates in response to said comparison result as to generate said clock when said difference is smaller than said reference value.

6. The semiconductor device according to claim 4, wherein
   at least one of said M clocks has a frequency higher than that of said system clock.

7. The semiconductor device according to claim 4, wherein
   said circuit operating in synchronization with said system clock is a dynamic RAM, and
   one of said M oscillator circuits which generates a clock having the lowest frequency comprises a battery backup mode control circuit which judges whether an operating mode of said dynamic RAM is a normal operation mode or a battery backup mode, and generates said clock when it is judged that said operating mode is said normal operation mode and generates said clock only during a refresh request when it is judged that said operating mode is said battery backup mode.

8. The semiconductor device according to claim 1, wherein
   said semiconductor substrate is an SOI substrate,
   said at least one MOS transistor includes a plurality of MOS transistors of the same conductivity type isolated from one another by partial isolation,
   said SOI substrate has a channel stopper doped with an impurity immediately below said partial isolation, and
   said body bias generation circuit supplies said body potential in common to said plurality of MOS transistors through said channel stopper.

9. The semiconductor device according to claim 8, wherein
   said at least one MOS transistor further includes another MOS transistor which is different in conductivity type from said plurality of MOS transistors, and
   said another MOS transistor and at least one of said plurality of MOS transistors adjacent thereto are isolated from each other by full isolation.

10. The semiconductor device according to claim 1, wherein
    said semiconductor substrate is an SOI substrate,
    said at least one MOS transistor includes M (M≧2) MOS transistors,
    said M MOS transistors are arranged, being divided into N (2≦N<M) function blocks, and
    said body bias generation circuit is divided into L (2≦L≦N) unit body bias generation circuits and said L unit body bias generation circuits individually supply body regions of MOS transistors belonging to L groups selected among said N function blocks with said body potential of reverse bias.

11. The semiconductor device according to claim 10, wherein
    at least two function blocks which are adjacent to each other among said N function blocks are isolated from each other by full isolation.

12. The semiconductor device according to claim 1, wherein said semiconductor substrate is an SOI substrate, said body bias generation circuit is formed in said main surface, and said body bias generation circuit and said at least one MOS transistor is isolated from each other by full isolation.

13. The semiconductor device according to claim 1, wherein said semiconductor substrate is an SOI substrate, and said SOI substrate has a bottom layer which is positioned immediately below said at least one MOS transistor, being in contact with a surface on the opposite side of said main surface of a buried insulating film and is a semiconductor layer in which an impurity is introduced.

14. The semiconductor device according to claim 13, further comprising:

a bottom potential generation circuit configured to selectively apply a potential of reverse bias relative to a source region of a MOS transistor positioned immediately above said bottom layer to said bottom layer.

15. The semiconductor device according to claim 14, wherein said bottom potential generation circuit selectively applies one of said potential of reverse bias and the same potential as that of said source region of said MOS transistor positioned immediately above said bottom layer to said bottom layer.

16. The semiconductor device according to claim 14, wherein said bottom potential generation circuit applies said potential in synchronization with said body bias generation circuit.

17. The semiconductor device according to claim 13, wherein said body bias generation circuit supplies said bottom layer with a potential supplied to said body region at the same time.

* * * * *